US011862241B2

United States Patent
Baek et al.

(10) Patent No.: US 11,862,241 B2
(45) Date of Patent: Jan. 2, 2024

(54) VARIABLE RESISTIVE MEMORY DEVICE, MEMORY SYSTEM INCLUDING THE SAME AND METHOD OF DRIVING THE VARIABLE RESISTIVE MEMORY DEVICE

(71) Applicant: SK hynix Inc., Icheon-si Gyeonggi-do (KR)

(72) Inventors: Seung Min Baek, Icheon-si Gyeonggi-do (KR); Min Chul Shin, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 214 days.

(21) Appl. No.: 17/536,557

(22) Filed: Nov. 29, 2021

(65) Prior Publication Data
US 2022/0366978 A1    Nov. 17, 2022

(30) Foreign Application Priority Data

May 11, 2021 (KR) .................. 10-2021-0060837

(51) Int. Cl.
*G11C 11/00* (2006.01)
*G11C 13/00* (2006.01)
*H10N 70/00* (2023.01)

(52) U.S. Cl.
CPC ........ *G11C 13/0026* (2013.01); *G11C 13/004* (2013.01); *G11C 13/0028* (2013.01);
(Continued)

(58) Field of Classification Search
CPC ............ G11C 13/0028; G11C 13/0038; G11C 13/004; G11C 13/0069
(Continued)

(56) References Cited

U.S. PATENT DOCUMENTS

| 9,324,423 | B2 | 4/2016 | Castro | |
|---|---|---|---|---|
| 2010/0329057 | A1* | 12/2010 | Lee | ..................... G11C 13/0004 365/203 |
| 2018/0059938 | A1* | 3/2018 | Kang | .................. G11C 11/1655 |

FOREIGN PATENT DOCUMENTS

KR      1020200017273 A      2/2020

* cited by examiner

*Primary Examiner* — Vu A Le
(74) *Attorney, Agent, or Firm* — William Park & Associates Ltd.

(57) ABSTRACT

A variable resistive memory device includes a memory cell, a first current-applying block, a second current-applying block and a mode setting circuit. The memory cell includes a first electrode, a second electrode, and a memory layer, the memory layer interposed between the first electrode and the second electrode. The first current-applying block is configured to flow a first current to the first electrode that flows from the first electrode to the second electrode. The second current-applying block is configured to flow a second current to the second electrode that flows from the second electrode to the first electrode. The mode setting circuit is configured to selectively provide any one of the first electrode of the first current-applying block and the second electrode of the second current-applying block with a first voltage. When the memory cell is selected, the selected current-applying block, among the first current-applying block and the second current-applying block, is driven. When the first current-applying block is selected, a second voltage is applied to the second electrode. When the second current-applying block is selected, the second voltage is applied to the first electrode. The first voltage has a voltage level by a threshold voltage higher than the second voltage.

40 Claims, 24 Drawing Sheets

(52) U.S. Cl.
CPC ...... G11C 13/0038 (2013.01); G11C 13/0069 (2013.01); H10N 70/826 (2023.02); H10N 70/841 (2023.02); *G11C 2213/79* (2013.01)

(58) Field of Classification Search
USPC ......................................................... 365/148
See application file for complete search history.

ND METHOD OF DRIVING THE
VARIABLE RESISTIVE MEMORY DEVICE, MEMORY SYSTEM INCLUDING THE SAME AND METHOD OF DRIVING THE VARIABLE RESISTIVE MEMORY DEVICE

CROSS-REFERENCES TO RELATED APPLICATION

The present application claims priority under 35 U.S.C. § 119(a) to Korean application number 10-2021-0060837, filed on May 11, 2021, in the Korean Intellectual Property Office, which is incorporated herein by reference in its entirety.

BACKGROUND

1. Technical Field

Various embodiments may generally relate to a memory device and a method of driving the same, more particularly to a variable resistive memory device configured to perform a memory operation by using bi-direction currents, a memory system including the variable resistive memory device, and a method of driving the variable resistive memory device.

2. Related Art

A memory device including a variable resistive material (hereinafter, referred to as a variable resistive memory device) may be used in various electronic device such as a computer, a digital camera, a cellular phone, a personal digital terminal, etc. The variable resistive material may have an electrical resistance changed in response to an electrical signal such as a voltage, a current, etc.

Generally, the variable resistive memory device may be well known as a unipolar memory device. That is, the variable resistive memory device may include a bit line, a word line and a memory cell connected between the bit line and the word line. For example, the memory cell may include a resistive element with a resistance value changed in accordance with an applying voltage. When a voltage difference between the selected bit line and the selected word line may be greater than a threshold voltage, the resistive element may be turned-on. A set current or a reset current may be determined by the voltage difference between the selected bit line and the selected word line and voltage applying ways so that the resistance value of the resistive element may be changed to perform the memory operation.

However, a crystalline state of the resistive element may be continuously changed by the set/reset current in one way from the bit line to the word line to generate a deterioration of a resistive layer.

In order to prevent the deterioration of the resistive layer in the variable resistive memory device, bi-directional currents may be applied to the memory cell to perform the memory operation. However, in order to drive the memory cell by using the bi-directional current, it may be required to use additional control transistors. Therefore, it may be required to decrease the number of control transistors.

Further, when the memory operation and a discharge operation may be performed by using the bi-directional currents, a voltage swing value may be increased. Thus, it may be difficult to secure reliability of the control transistor.

SUMMARY

In example embodiments of the present disclosure, a variable resistive memory device may include a memory cell, a first current-applying block, a second current-applying block and a mode setting circuit. The memory cell may include a first electrode, a second electrode, and a memory layer, the memory layer interposed between the first electrode and the second electrode. The first current-applying block may be configured to flow a first current to the first electrode that flows from the first electrode to the second electrode. The second current-applying block may be configured to flow a second current to the second electrode that flows from the second electrode to the first electrode. The mode setting circuit may be configured to selectively provide any one of the first electrode of the first current-applying block and the second electrode of the second current-applying block with a first voltage. When the memory cell is selected, the selected current-applying block, among the first current-applying block and the second current-applying block, may be driven. When the first current-applying block is selected, a second voltage may be applied to the second electrode. When the second current-applying block is selected, the second voltage may be applied to the first electrode. The first voltage may have a voltage level by a threshold voltage higher than the second voltage.

In example embodiments of the present disclosure, a memory system may include a controller and a variable resistive memory device. The controller may be configured to output a control command. The variable resistive memory device may include a control circuit and a plurality of mats. The control circuit may receive the control command from the controller to generate control signals. Each of the mats may include a plurality of memory cells configured to perform a memory operation and a discharge operation by using a forward current or a reverse current in response to the control signals. The memory cells of the variable resistive memory device may be positioned at intersection points of a plurality of bit lines and a plurality of word lines. Each of the bit lines may be selectively connected to a first hierarchical bit line structure configured to receive a first voltage and a second hierarchical bit line structure configured to receive a second voltage that is lower than the first voltage. Each of the word lines may be selectively connected to a first hierarchical word line structure configured to receive the second voltage and a second hierarchical word line structure configured to receive the first voltage. The control circuit may be configured to generate control signals for selecting the memory cell in the selected mat, control signals for transmitting the forward current, control signals for transmitting the reverse current, and a discharge control signal for discharging a selected bit line and a selected word line during the discharge operation, a current for the discharge operation flowing in an opposite direction compared to a current direction for the memory operation.

In example embodiments of the present disclosure, according to a method of driving a variable resistive memory device, the variable resistive memory device may include a memory cell, a first hierarchical bit line structure, a second hierarchical bit line structure, a first hierarchical word line structure and a second hierarchical word line structure. The memory cell may include a bit line, a resistive layer and a word line. The first hierarchical bit line structure may be selectively connected between the bit line and a first voltage terminal configured to provide a first voltage. The second hierarchical bit line structure may be connected between a second voltage terminal, which may be configured to provide a second voltage lower than the first voltage, and the bit line. The first hierarchical word line structure may be connected between the word line and the second voltage terminal. The second hierarchical word line structure may be connected between the word line and the first voltage terminal.

The memory cell may perform a memory operation by using a forward current that flows from the first hierarchical bit line structure to the first hierarchical word line through the memory cell. After performing the memory operation of the memory cell by using the forward current, a discharge path may be generated in each of the second hierarchical word line structure and the second hierarchical bit line structure to discharge residual voltages of the bit line and the word line. The memory cell may then perform a memory operation by using a reverse current that flows from the second hierarchical word line structure to the second hierarchical bit line through the memory cell. After performing the memory operation of the memory cell by using the reverse current, a discharge path may be generated in each of the first hierarchical bit line structure and the first hierarchical word line structure to discharge residual voltages of the bit line and the word line.

In example embodiments of the present disclosure, a variable resistive memory device may include a memory cell, a first hierarchical bit line structure, a first hierarchical word line structure, a second hierarchical word line structure and a second hierarchical bit line structure. The memory cell may include a bit line, a resistive layer and a word line. The first hierarchical bit line structure may include a plurality of first hierarchical conductive lines, a plurality of first switches and a first discharge switch. The first hierarchical conductive lines may be selectively connected between the bit line and a first voltage terminal. The first switches may be selectively connected between the first hierarchical conductive lines. The first discharge switch may be connected between any one of the first hierarchical conductive lines and a discharge terminal. The first hierarchical word line structure may include a plurality of second hierarchical conductive lines, a plurality of second switches and a second discharge switch. The second hierarchical conductive lines may be selectively connected between the word line and a second voltage terminal. The second switches may be selectively connected between the second hierarchical conductive lines. The second discharge switch may be connected between any one of the second hierarchical conductive lines and the discharge terminal. The second hierarchical word line structure may include a plurality of third hierarchical conductive lines, a plurality of third switches and a third discharge switch. The third hierarchical conductive lines may be selectively connected between the word line and the first voltage terminal. The third switches may be selectively connected between the third hierarchical conductive lines. The third discharge switch may be connected between any one of the third hierarchical conductive lines and the discharge terminal. The second hierarchical bit line structure may include a plurality of fourth hierarchical conductive lines, a plurality of fourth switches and a fourth discharge switch. The fourth hierarchical conductive lines may be selectively connected between the bit line and the second voltage terminal. The fourth switches may be selectively connected between the fourth hierarchical conductive lines. The fourth discharge switch may be connected between any one of the fourth hierarchical conductive lines and a discharge terminal.

In example embodiments, the first voltage terminal may provide a first voltage. The second voltage terminal may provide a second voltage. A voltage difference may be formed between the first voltage and the second voltage to generate a conductive path in the resistive layer.

The first switches and the first discharge switch in the first hierarchical bit line structure and the third switches and the third discharge switch in the second hierarchical word line structure may include first conductive type transistors.

The second switches and the second discharge switch in the first hierarchical word line structure and the fourth switches and the fourth discharge switch in the second hierarchical bit line structure may include second conductive type transistors that are opposite to the first conductive type transistors.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Figure 1:
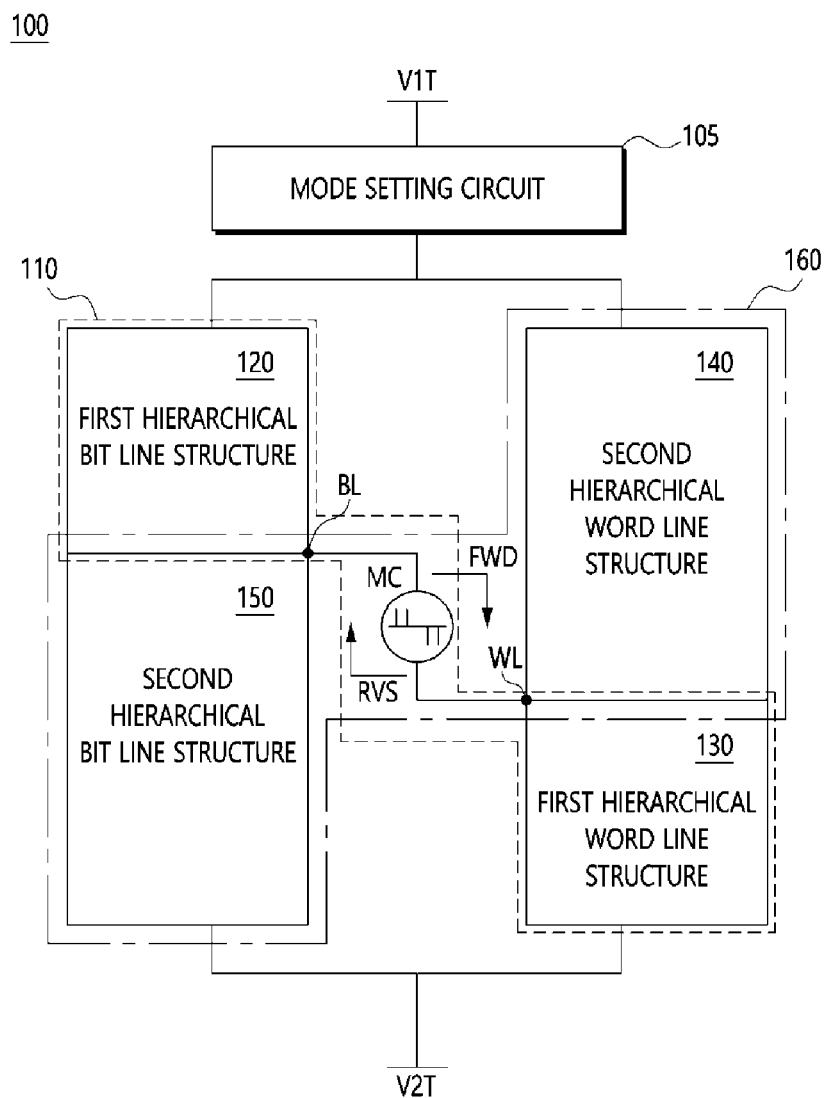
FIG. 1 is a block diagram illustrating a variable resistive memory device in accordance with example embodiments.

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

A variable resistive memory device may include a plurality of memory cells. Each of the memory cells may include a bit line, a memory layer, and a word line. For example, the memory layer may include a resistive layer illustrated later.

The bit line may be hierarchically connected to a local bit line and a global bit line to form a hierarchical bit line structure. The word line may be hierarchically connected to a local word line and a global word line to form a hierarchical word line structure.

The hierarchical bit line structure may include a global bit line switch that is selectively connected between the global bit line and the local bit lines, and a local bit line switch that is selectively connected between the local bit line and the bit lines. The hierarchical word line structure may include a global word line switch that is selectively connected between the global word line and the local word lines, and a local word line switch that is selectively connected between the local word line and the word lines.

A variable resistive memory device may include a plurality of global bit line switches, a global word line switches, a local bit line switches, and a local word line switches.

One of the global bit line switches may be connected between one of the global word lines and a plurality of local bit lines. One of the global word line switches may be connected between one of the global word lines and a plurality of local word lines. One of the local bit line switches may be connected between one of the local bit lines and a plurality of bit lines. One of the local word line switches may be connected between one of the local word lines and a plurality of word lines. According to an address, one of the global bit line switches, one of the global word line switch, one of the local word line switch, and one of the local bit line switch may be selectively turned on.

In order to prevent the deterioration of the resistive layer of the memory cell in the variable resistive memory device, bi-directional currents may be periodically applied to the resistive layer.

In order to apply the bi-directional currents to the memory cell, the bit line that corresponds to a first electrode may be connected to a first hierarchical bit line structure with a pull-up function and a second hierarchical bit line structure with a pull-down function. The word line that corresponds to a second electrode may be connected to a first hierarchical word line structure with a pull-down function and a second hierarchical word line structure with a pull-up function. Thus, the memory cell may perform a first memory operation by using a first current that flows in a first direction from the first hierarchical bit line structure to the first hierarchical word line structure. The memory cell may perform a second memory operation by using a second current that flows in a second direction from the second hierarchical word line structure to the second hierarchical bit line structure.

After performing the memory operation of the memory cell, in order to perform the next memory operation, residual voltages in a selected bit line and a selected word line may be discharged.

In a general bi-directional current-driven type variable resistive memory device, a global bit line discharge switch, a global word line discharge switch, a local bit line discharge switch, and a local word line discharge switch that are parallel to a global bit line switch, a global word line switch, a local bit line switch, and a local word line switch, respectively, may be provided to each of the hierarchical bit line structure and the hierarchical word line structure.

In order to perform a discharge operation, the global bit line switch and the global bit line discharge switch may be designed to be complementarily operated, and the global word line switch and the global word line discharge switch may also be designed to be complementarily operated. Further, the local bit line switch and the local bit line discharge switch may be designed to be driven in reverse. The local word line switch and the local word line discharge switch may also be designed to be driven in reverse. The first and second hierarchical bit line structures and the first and second hierarchical word line structures may be individually controlled by sub-decoders.

Therefore, in order to drive the memory cell of the variable resistive memory device by using the bi-directional currents, at least eight discharge switches and four sub-decoders have been required.

Further, the bit line that corresponds to the electrode of the memory cell may be connected between the first and second hierarchical bit line structures with the pull-up function and the pull-down function, respectively. The word line that corresponds to the electrode of the memory cell may also be connected between the first and second hierarchical word line structures with the pull-down function and the pull-up function, respectively. Thus, it was required to form a plurality of contacts with different conductive types in the bit line and the word line so that a relatively large area may also be required.

Moreover, the global switches and the local switches, with performing the memory operation, was alternately swung fully from a positive voltage band to a negative voltage band during uniform periods. Thus, it was difficult to secure reliability of the switches.

A bi-directional current-driven type variable resistive memory device of example embodiments may include discharge switches that are connected to a global bit line switch and a global word line switch, in parallel. A first local word line switch of a first hierarchical word line structure and a second local bit line switch of a second hierarchical bit line structure with a pull-down function may be individually controlled by a sub-decoder. Thus, the number of contacts that are formed in the memory cell may be reduced, thereby securing the area of a mat.

Figure 2:
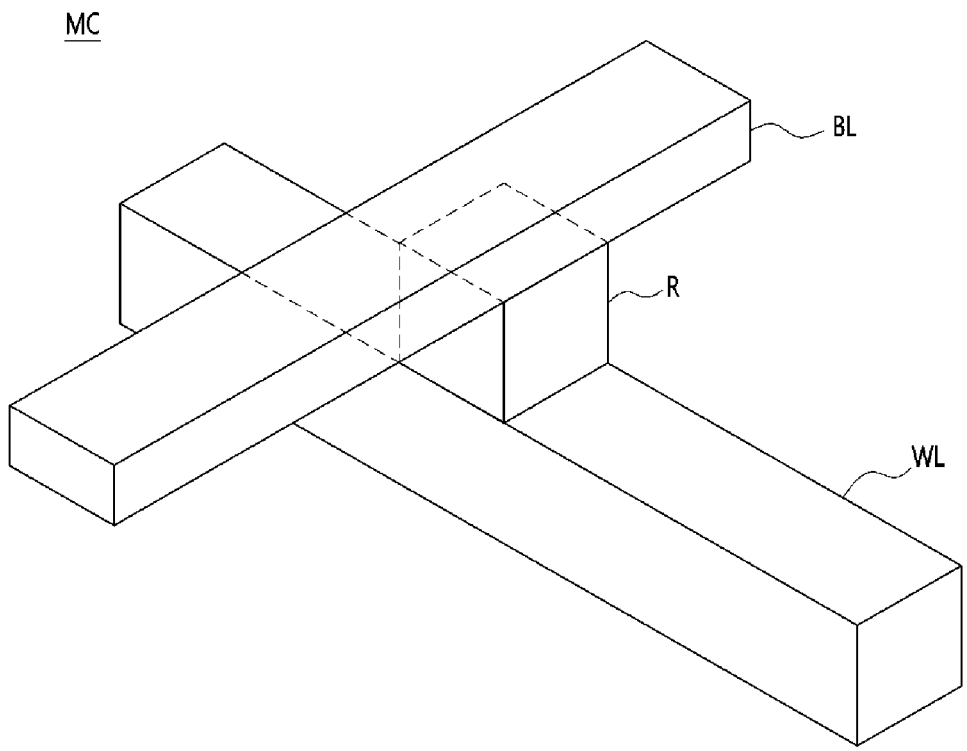
FIG. 2 is a perspective view illustrating a variable resistive memory device in accordance with example embodiments.

FIG. 1 is a block diagram illustrating a variable resistive memory device in accordance with example embodiments, and FIG. 2 is a perspective view illustrating a variable resistive memory device in accordance with example embodiments.

Referring to FIG. 1, a variable resistive memory device 100 may include a memory cell MC, a mode setting circuit 105, a first current-applying block 110 and a second current-applying block 160.

Referring to FIG. 2, the memory cell MC may include a bit line BL, a word line WL and a resistive layer R. The bit line BL may be selectively connected to a first voltage terminal V1T configured to provide a first voltage V1 or a second voltage terminal V2T configured to provide a second voltage V2. The word line WL may be selectively connected to the first voltage terminal V1T configured to provide the first voltage V1 or the second voltage terminal V2T configured to provide the second voltage V2. When the difference between a voltage of the bit line BL and a voltage of the word line WL is greater than a threshold voltage of the resistive layer R, the memory cell MC with a cross point type may be turned-on. The threshold voltage may correspond to a voltage level for forming a conductive path in the resistive layer R for transmitting a current-voltage between the bit line BL and the word line WL.

For example, the first voltage terminal V1T may be any one of a reset voltage terminal, a set voltage terminal, and a read voltage terminal. The reset voltage terminal, the set voltage terminal, and the read voltage terminal may be selectively connected to the mode setting circuit 105. The second voltage V2 that is provided from the second voltage terminal V2T may have a voltage level for generating a reset voltage, a set voltage, and a read voltage based on a difference between the second voltage V2 and the first voltage V1 that is provided from the first voltage terminal V1T.

As disclosed above, the resistive layer R may change a resistive phase. When a voltage that is greater than the threshold voltage Vth is applied to the resistive layer R, a conductive path may be formed in the resistive layer R, and a resistance of the resistive layer R may be changed to perform a memory operation. Meanwhile, when the read voltage is applied to the resistive layer R through the first voltage terminal V1T and the second voltage terminal V2, the conductive path may be generated in the resistive layer R, but a phase change of the resistive layer R might not be generated. A sense amplifier that is included in a control circuit may sense the value of a read current to determine the resistance states of the resistive layer R.

Therefore, the memory cell MC of example embodiments may perform a self-selection function by using the voltage difference between the bit line BL and the word line WL.

The resistive layer R may include a chalcogenide composition. The chalcogenide composition may include an alloy that includes at least two elements in an In—Sb—Te (IST) alloy system, such as $In_2Sb_2Te_5$, $In_1Sb_2Te_4$, $In_1Sb_4Te_7$, etc., an alloy that includes at least two elements in a Ge—Sb—Te (GST) alloy system, such as $Ge_8Sb_5Te_8$, $Ge_2Sb_2Te_5$, $Ge_1Sb_2Te_4$, $Ge_1Sb_4Te_7$, $Ge_4Sb_4Te_7$, etc.

The resistive layer R may include a chalcogenide composition, such as Ge—Te, In—Se, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—P, etc.

The memory cell MC may include an Ovonic threshold switch (OTS) layer. The OTS layer may include a chalcogenide composition that includes any one of the above-mentioned chalcogenide compositions. For example, the OTS layer may include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, Ge—As—Bi—Se, etc.

Although not depicted in drawings, the variable resistive memory device 100 may be wholly controlled by control commands provided from a controller. The controller may provide the variable resistive memory device 100 with the control commands, such as an address command, an operation command, etc. Further, data may be interfaced between the controller and the variable resistive memory device 100. In order to operate the memory cell of the variable resistive memory device 100 by the bi-directional currents, the controller may additionally provide the variable resistive memory device 100 with a direction command DIR for changing the current direction.

The variable resistive memory device 100 may further include a control circuit. The control circuit may receive the commands from the controller to generate various signals. The control circuit may include a decoding circuit. The decoding circuit may receive the address command to generate signals for selecting the memory cell (hereinafter, selection signals). The decoding circuit may generate the selection signals for selecting the global bit line switch, the global word line switch, the local bit line switch, and the local word line switch in the hierarchical bit line structure and the hierarchical word line structure.

The global bit line, the global bit line switch, the local bit line, and the local bit line switch in the hierarchical bit line structure and the global word line, the global word line switch, the local word line, and the local word line switch in the hierarchical word line structure may be formed in the control circuit.

The control circuit may be positioned on a level that is coplanar with a level on which a memory cell array that includes the memory cells MC may be positioned. Alternatively, the control circuit may be positioned under the memory cell array. The structure in which the control circuit is positioned under the memory cell array may be referred to as a periphery under cell (PUC) structure, illustrated later.

Figure 3:
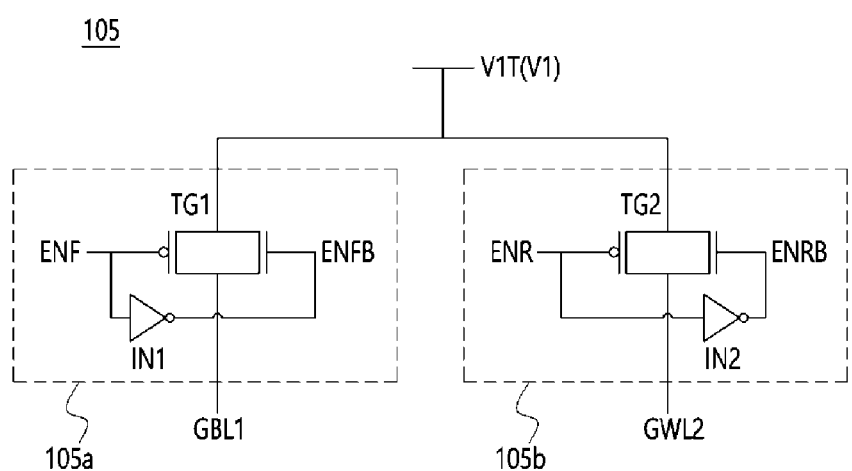
FIG. 3 is a circuit diagram illustrating a mode setting circuit of a variable resistive memory device in accordance with example embodiments.

FIG. 3 is a circuit diagram illustrating a mode setting circuit of a variable resistive memory device in accordance with example embodiments.

Referring to FIGS. 1 and 3, the mode setting circuit 105 may include a forward determining unit 105a and a reverse determining unit 105b.

The forward determining unit 105a may output the first voltage V1 that is provided from the first voltage terminal V1T to a first global bit line GBL1 in response to a forward enable signal ENF. For example, the forward determining unit 105a may include a transfer gate TG1 and an inverter IN1. The transfer gate TG1 may include a PMOS transistor and an NMOS transistor. For example, the forward enable signal ENF and an inverted forward enable signal ENFB that is inverted by the inverter IN1 may be input to the PMOS transistor and the NMOS transistor in the transfer gate TG1, respectively, so that the transfer gate TG1 may be turned-on. Thus, the first voltage V1 may be selectively provided to the first global bit line GBL1.

The reverse determining unit 105b may output the first voltage V1 that is provided from the first voltage terminal V1T to a second global bit line GBL2 in response to a reverse enable signal ENR. For example, the reverse determining unit 105b may include a transfer gate TG2 and an inverter IN2. The reverse enable signal ENR may be input to a PMOS transistor of the transfer gate TG2. An inverted reverse enable signal ENRB that is inverted by the inverter IN2 may be input to an NMOS transistor of the transfer gate TG2. When the reverse enable signal ENR is enabled to a low level, the transfer gate TG2 may be turned-on. Thus, the first voltage V1 may be selectively provided to the second global bit line GBL2.

The forward enable signal ENF and the reverse enable signal ENR may be generated by using a direction control signal (not shown) based on the direction command that is provided from the controller, not limited thereto. For example, the levels of the forward enable signal ENF and the reverse enable signal ENR may be changed whenever the direction command is generated.

Figure 4A:
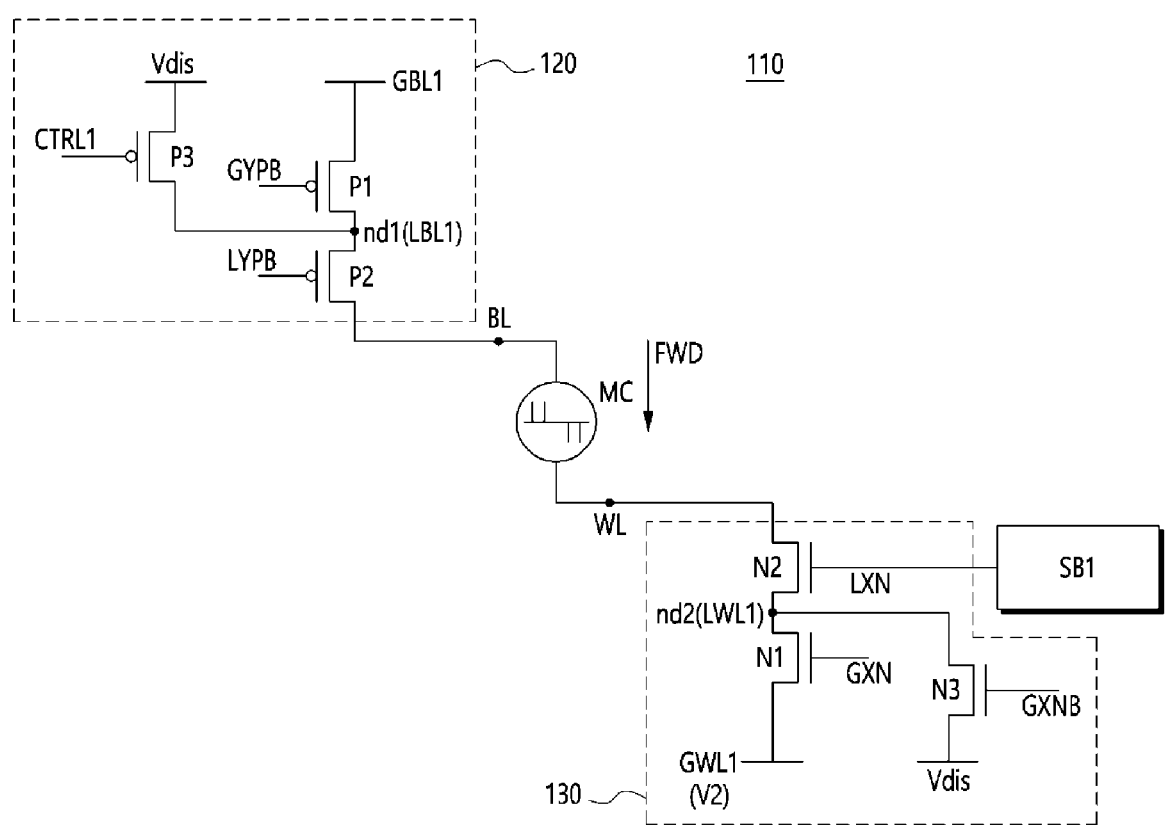
FIG. 4A is a circuit diagram illustrating a first current-applying block of a variable resistive memory device in accordance with example embodiments.

FIG. 4A is a circuit diagram illustrating a first current-applying block of a variable resistive memory device in accordance with example embodiments.

Referring to FIGS. 1 to 4A, the first current-applying block 110 may apply a current that flows from the bit line BL of the selected memory cell MC to the word line WL. This current may be referred to as a forward current FWD.

The first current-applying block 110 may include the first hierarchical bit line structure 120 and the first hierarchical word line structure 130.

The first hierarchical bit line structure 120 may include a conductive path for transmitting a current and a voltage from the first global bit line GBL1 to the first bit line BL. The first global bit line GBL may selectively receive the first voltage V1 from the forward determining unit 105a. The first hierarchical bit line structure 120 may include a first global bit line GBL1, a first global bit line switch P1, a first local bit line LBL1, and a first local bit line switch P2. The first global bit line GBL1 and the first local bit line LBL1 may include hierarchically arranged conductive lines.

The first global bit line switch P1 may transmit the first voltage V1 in the first global bit line GBL1 to a first connection node nd1 in response to a first global bit line selection signal GYPB. The first connection node nd1 may be shown as a connection node on the first global bit line switch P1 and the first local bit line switch P2. However, the first connection node nd1 may correspond to the first local bit line LBL1. For example, the first global bit line switch P1 may include a PMOS transistor as a pull-up element.

The first local bit line switch P2 may be connected between the first connection node nd1 and the bit line BL. The first local bit line switch P2 may selectively transmit a voltage of the first connection node nd1 to the bit line BL in response to a first local bit line selection signal LYPB. For example, the first local bit line switch P2 may include a PMOS transistor as a pull-up element.

In example embodiments, the selected first global bit line GBL1, the selected first local bit line LBL1, and the selected bit line BL is illustrated in the drawings. Alternatively, the variable resistive memory device 100 may include a plurality of first global bit lines GBL1, a plurality of first local bit lines LBL1 and a plurality of bit lines BL.

For example, the plurality of first local bit lines LBL1 may be connected to one first global bit line GBL1. The first global bit line switch P1 may be connected to the plurality of first local bit lines LBL1. Further, the plurality of bit lines BL may be connected to one first local bit line LBL1. The first local bit line switch P2 may be connected to the plurality of bit lines BL.

The first global bit line switch P1 and the first local bit line switch P2 may include a plurality of switches, respectively. The plurality of switches P1 and P2 may be selectively turned-on by a first global bit line selection signal GYPBN<n> and a first local bit line selection signal LYPB<n> that are provided from the control circuit. This structure may be applied to the second hierarchical bit line structure 150.

As mentioned above, the bit line BL may correspond to a first electrode of the memory cell MC. When the first global bit line switch P and the first local bit line switch P2 is turned-on, the first voltage V1 may be applied to the bit line BL selected.

The first hierarchical bit line structure 120 may further include a first discharge switch P3, which does not take an active part in the operation for applying the forward current FWD. The first discharge switch P3 may be connected between a discharge voltage terminal Vdis and the first connection node nd1 (i.e., the first local bit line LBL1). In example embodiments, the first discharge switch P3 may include a plurality of switches, each corresponding to one of the first global bit line switches P1.

The first discharge switch P3 may include a transistor with a type that is substantially the same as that of the first global bit line switch P1 and the first local bit line switch P2, for example, a PMOS transistor as a pull-up element. For example, the discharge voltage terminal Vdis may include a ground voltage. The first discharge switch P3 may discharge the voltage of the first local bit line LBL1 (i.e., the residual voltage of the selected bit line BL) to the discharge voltage terminal Vdis in response to a first control signal CTRL1. The first control signal CTRL1 may be generated based on the direction command DIR, illustrated later.

The first hierarchical word line structure 130 may generate a conductive path configured to provide a current and a voltage from the word line WL to the first global word line GWL1. The first hierarchical word line structure 130 may include a first global word line GWL1, a first global word line switch N1, a first local word line LWL1 and a first local word line switch N2. The first global word line GWL1 and the first local word lines LWL1 may include hierarchically arranged conductive lines.

The first local word line switch N2 may form a conductive path between the word line WL and a second connection node nd2 (i.e., the first local word line LWL1) in response to a first local word line selection signal LXN.

The first local word line switch N2 may be selectively connected between the word line WL and the second connection node nd2 (i.e., the first local word line LWL1) in response to the first local word line selection signal LXN. The first local word line selection signal LXN may be a sub-decoding signal that is provided from a first sub-decoder SB1 to control the current directions and discharge directions, illustrated later.

The first global word line switch N1 may be selectively connected between the second connection node, i.e., the first local word line LWL1, and the first global word line GWL1 in response to a first global word line selection signal GXN. The first global word line GWL1 may be connected to the second voltage terminal V2T to receive the second voltage V2. The second voltage V2 may be lower than the first voltage V1 by the threshold voltage Vth. For example, the second voltage V2 may have a negative level. The first global word line switch N1 and the first local word line switch N2 may include NMOS transistors as a pull-down element.

In example embodiments, the selected first global word line GWL1, the selected first local word line LWL1 and the selected word line WL may be illustrated in drawings. However, the variable resistive memory device 100 may include a plurality of first global word lines GWL1, a plurality of first local word lines LWL1 and a plurality of word lines WL.

For example, the plurality of first local word lines LWL1 may be connected to one first global word line GWL1. The first global word line switch N1 may be connected to the plurality of first local word lines LWL1. Further, the plurality of word lines WL may be connected to one first local word line LWL1. The first local word line switch N2 may be connected to the plurality of word lines WL. Thus, the first global word line switch N1 and the first local word line switch N2 may include a plurality of switches, respectively. The first global word line switch N1 may be selectively turned-on by a first global word line selection signal GXN. The first local word line switch N2 may be selectively turned-on by a first local word line selection signal LXN that is provided from the control circuit.

The first hierarchical word line structure 130 may further include a second discharge switch N3 that does not take an active part in the operation for applying the forward current FWD. The second discharge switch N3 may be connected between the discharge voltage terminal Vdis and the first local word line LWL1. The second discharge switch N3 may include a transistor with a type that is substantially the same as that of the first global word line switch N1 and the first local word line switch N2, for example, an NMOS transistor. The second discharge switch N3 may discharge the voltage of the first local word line LWL1 (i.e., the residual voltage of the word line WL) in response to an inverted first global word line selection signal GXNB. Further, the second discharge switch N3 may correspond to the first local word line LWL1.

The first current-applying block 110 may be operated as follows.

When the forward current FWD is applied to the selected memory cell MC, the first voltage V1 may be provided to the first global bit line GBL1 based on the operation of the forward determining unit 105a. The control circuit may enable the first global bit line selection signal GYPB and the first local bit line selection signal LYPB to a logic "low" level. The control circuit may enable the first local word line selection signal LXN and the first global word line selection signal GXN to a logic "high" level. Thus, the first global bit line switch P1, the first local bit line switch P2, the first local word line switch N1, and the first global word line switch N1 may be turned-on to generate the voltage difference between the bit line BL and the word line WL that is greater than the threshold voltage Vth. Therefore, the current by the first voltage V1 that is transmitted to the bit line BL may flow into the word line WL through the memory cell MC. In this process, the phase change may be generated in the resistive layer R of the memory cell MC. The phase change may be a set state, a reset state, or a read state in accordance with the kind of first voltage V1.

Figure 4B:
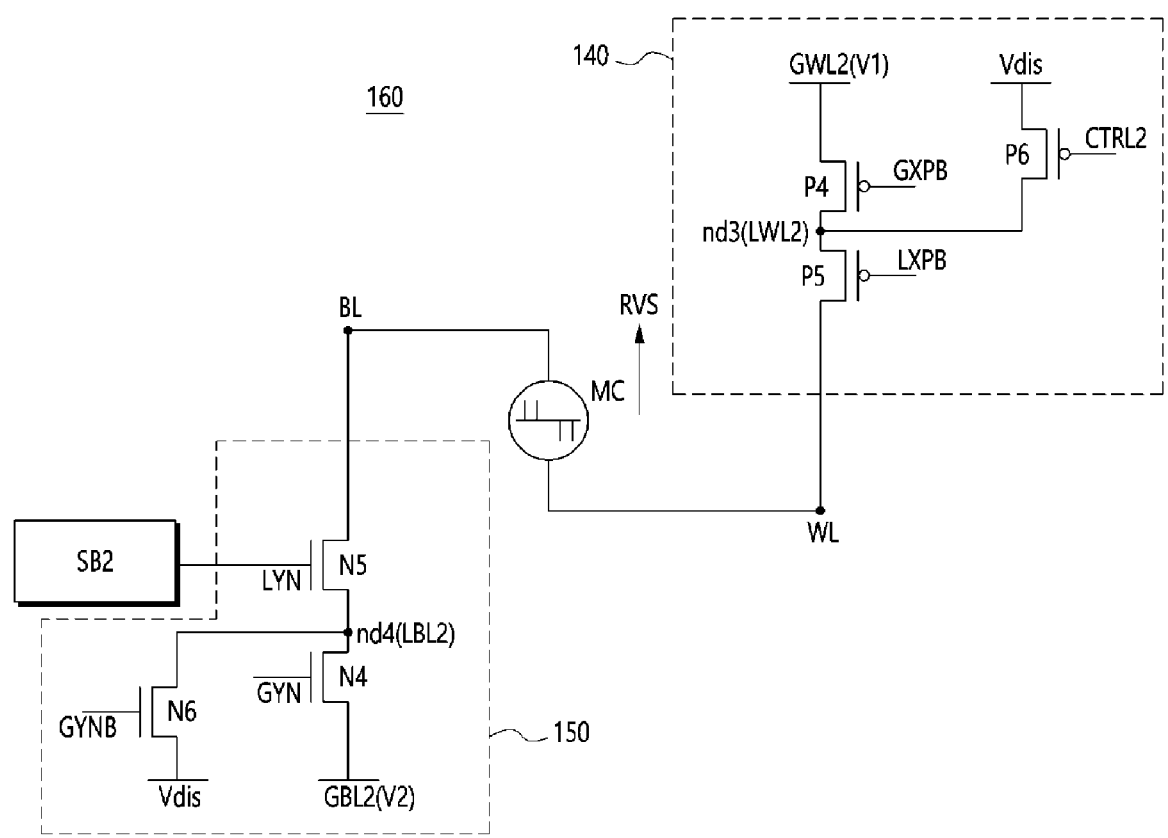
FIG. 4B is a circuit diagram illustrating a second current-applying block of a variable resistive memory device in accordance with example embodiments.

FIG. 4B is a circuit diagram illustrating a second current-applying block of a variable resistive memory device in accordance with example embodiments.

Referring to FIGS. 1 to 4B, the second current-applying block 160 may apply a current that flows from the word line WL of the selected memory cell MC to the bit line BL. This current may be referred to as a reverse current RVS.

The second current-applying block 160 may include the second hierarchical word line structure 140 and the second hierarchical bit line structure 150.

The second hierarchical word line structure 140 may include a conductive path for transmitting a current and a voltage from the second global word line GWL2 to the second word line WL. The second global word line GWL2 configured to transmit the first voltage V1 that is output from the reverse determining unit 105b to the word line WL. The second hierarchical word line structure 140 may include a second global word line GWL2, a second global word line switch P4, a second local word line LWL2, and a second local word line switch P5. The second global word line GWL2 and the second local word line LWL2 may include hierarchically arranged conductive lines.

The second global word line switch P4 may be connected between the second global word line GWL2 and a third connection node nd3 that corresponds to the second local word line LWL2. The second global word line switch P4 may transmit the voltage of the selected second global word line GWL2, for example, the first voltage V2, to the second local word line LWL2 in response to a second global word line selection signal GXPB. The second local word line switch P5 may be connected between the second local word line LWL2 and the word line WL. The second local word line switch P5 may transmit a voltage of the second local word line LWL2 to the selected word line WL in response to a second local word line selection signal LXPB. For example, the second global word line switch P4 and the second local word line switch P5 may include a PMOS transistor as a pull-up element.

The second hierarchical word line structure 140 may further include a third discharge switch P6 that does not take an active part in the operation for applying the reverse current RVS. The third discharge switch P6 that is connected between the discharge voltage terminal Vdis and the second local word line LWL2. The third discharge switch P6 may include a transistor with a type that is substantially the same as that of the second global word line switch P5 and the second local word line switch P4, for example, a PMOS transistor. The third discharge switch P6 may discharge the voltage of the second local word line LWL2 (i.e., the residual voltage of the word line WL) in response to a second control signal CTRL2. The second control signal CTRL2 may have an inverted level with respect to the first control signal CTRL1. The third discharge switch P6 may be connected to the second local word line LWL2.

The second hierarchical bit line structure 150 may include a conductive path configured to transmit a current from the bit line BL to the second global bit line GBL2. The second hierarchical bit line structure 150 may include a second global bit line GBL2, a second global bit line switch N4, a second local bit line LBL2 and a second local bit line switch N5.

The second local bit line switch N5 may be connected between the bit line BL and a second connection node nd4 that corresponds to the second local bit line LBL2. The second local bit line switch N5 may be electrically connected between the second connection node nd4 and the bit line BL in response to a second local bit line selection signal LYN. The second local bit line selection signal LYN may be a sub-decoding signal that is provided from a second sub-decoder SB2 to control the current directions and discharge directions, illustrated later.

The second global bit line switch N4 may be connected between the fourth connection node nd4 and the second global bit line GBL2. The second global bit line switch N4 may be electrically connected between the second global bit line GBL2 and the fourth connection node nd4 in response to a second global bit line election signal GYN. For example, the second global bit line switch N4 and the second local bit line switch N5 may include NMOS transistors.

The second hierarchical bit line structure 150 may further include a fourth discharge switch N6 that does not take an active part in the operation for applying the reverse current RVS. The fourth discharge switch N6 that is connected between the discharge voltage terminal Vdis and the second local bit line LBL2. The fourth discharge switch N6 may include a transistor with a type that is substantially the same as that of the second global bit line switch N4 and the second local bit line switch N5, for example, an NMOS transistor. The fourth discharge switch N6 may discharge the voltage of the second local bit line LWL1, i.e., the residual voltage of the bit line BL in response to an inverted second global bit line selection signal. Further, the fourth discharge switch N6 may be connected to the second local bit line LBL2.

The second current-applying block 160 may be operated as follows.

When the applying of the reverse current RVS to the selected memory cell MC is determined, the first voltage V1 may be provided to the second global word line GWL2 based on the operation of the reverse determining unit 105b. The control circuit may enable the second global word line selection signal GXPB and the second local word line selection signal LXPB to a low level and the second local bit line selection signal LYN and the second global bit line selection signal GYN to a high level. Thus, the second global word line switch P4, the second local word line switch P5, the second local bit line switch N5, and the second global bit line switch N4 may be turned-on. Therefore, the reverse current RVS may flow from the word line WL to the second global bit line GBL2 through the memory cell MC to perform the memory operation.

Figure 5A:
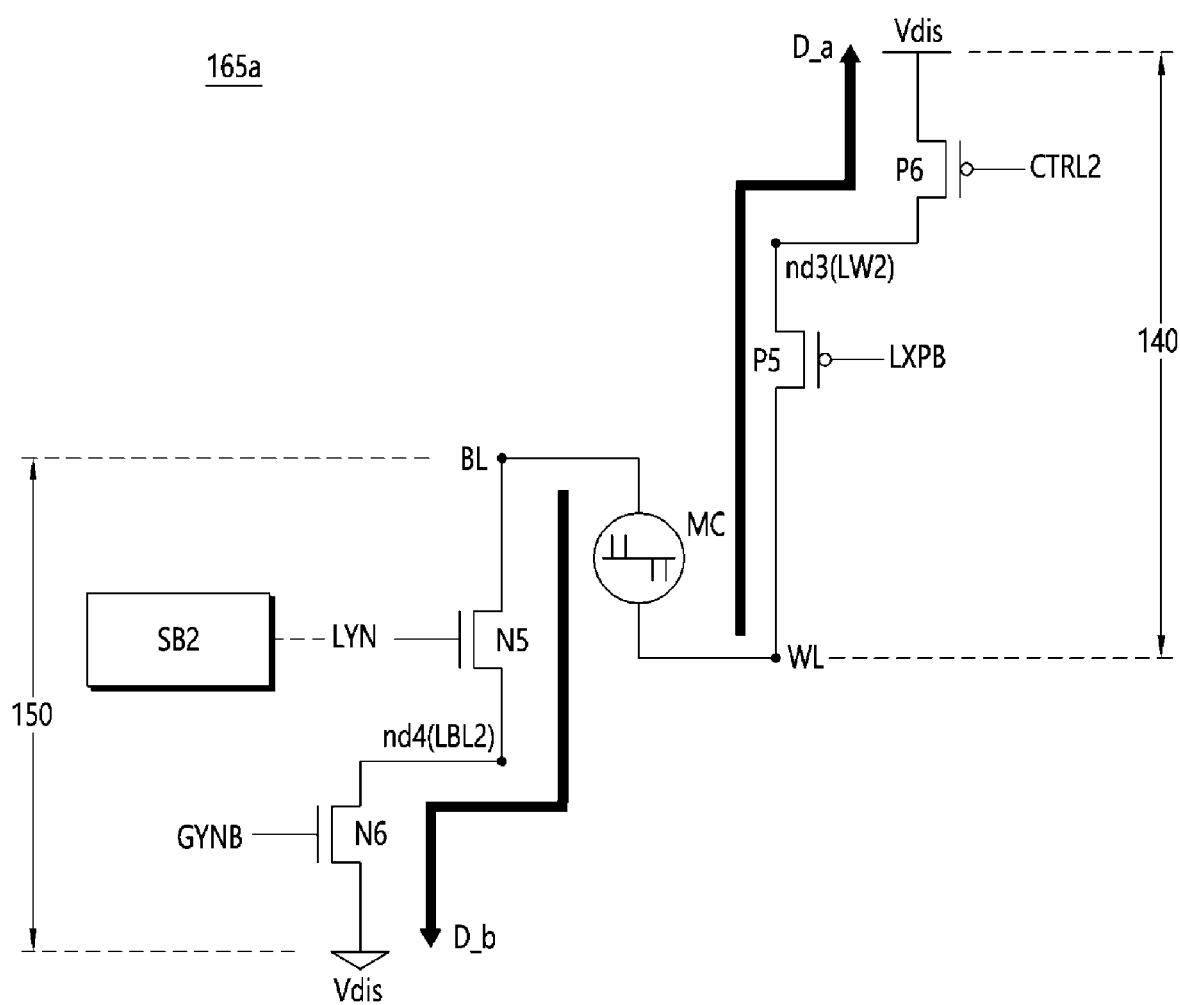
FIG. 5A is a circuit diagram illustrating a first discharge block in accordance with example embodiments.

FIG. 5A is a circuit diagram illustrating a first discharge block in accordance with example embodiments.

Referring to FIGS. 1 to 5A, the variable resistive memory device 100 may include a first discharge block 165a. The first discharge block 165a may discharge the residual voltages in the bit line BL and the word line WL after applying the forward current FWD to the selected memory cell MC.

The first discharge block 165a may be a part of the second hierarchical word line structure 140 and the second hierarchical bit line structure 150.

The first discharge block 165a may include the third discharge switch P6 and the second local word line switch P5 in the second hierarchical word line structure 140 and the second local bit line switch N5 and the fourth discharge switch N6 in the second hierarchical bit line structure 150.

For example, the control circuit may enable the second control signal CTRL2 and the second local word line selection signal LXPB to a low level to turn-on the third discharge switch P6 and the second local word line switch P5. The second control signal CTRL2 may be preset to be enabled in the discharge operation. Thus, a first discharge path D_a may be formed between the word line WL and the discharge voltage terminal Vdis to discharge the residual voltage of the word line WL through the first discharge path D_a. The first discharge path D_a may be formed based on operations of the switches P3, P2, N2, and N3, which might not be operated in applying the forward current FWD. Because a switch that is driven in applying the forward current FWD may be different from a switch that is driven in the discharging operation, stresses caused by a continuous operation of the switches may be decreased.

The control circuit may enable the second local bit line selection signal LYN that is controlled by the second sub-decoder SB2 and the inverted second global bit line selection signal GYNB to turn-on the second local word line switch N5 and the fourth discharge switch N6. The inverted second global bit line selection signal GYNB may be preset to be enabled in the discharge operation. Thus, a second discharge path D_b may be formed between the bit line BL and the discharge voltage terminal Vdis. The residual voltage of the bit line BL may be discharged by using the switches that might not be operated in applying the forward current FWD.

Figure 5B:
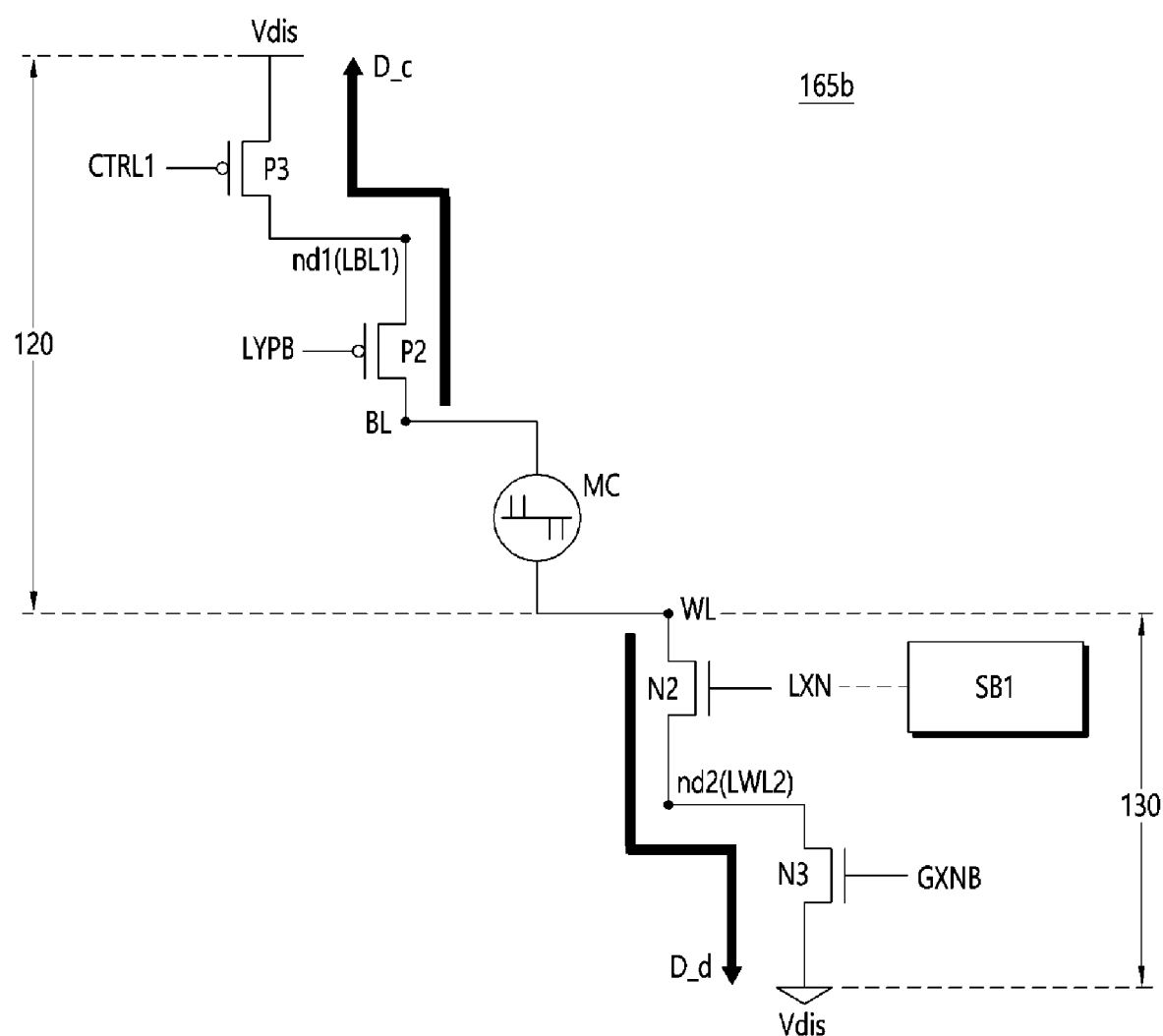
FIG. 5B is a circuit diagram illustrating a second discharge block in accordance with example embodiments.

FIG. 5B is a circuit diagram illustrating a second discharge block in accordance with example embodiments.

Referring to FIGS. 1 to 5B, the variable resistive memory device 100 may include a second discharge block 165b. The second discharge block 165b may discharge the residual voltages in the bit line BL and the word line WL after applying the reverse current RVS to the selected memory cell MC.

The second discharge block 165b may include the first hierarchical bit line structure 120 and the second hierarchical word line structure 130.

The second discharge block 165b may include the first discharge switch P3 and the first local bit line switch P2 in the first hierarchical bit line structure 120 and the first local word line switch N2 and the second discharge switch N3 in the second hierarchical word line structure 130.

For example, the control circuit may enable the first control signal CTRL1 and the first local bit line selection signal LYPB to a low level to turn-on the first discharge switch P3 and the first local bit line switch P2. The first control signal CTRL1 may be preset to be enabled in the discharge operation. Thus, a third discharge path D_c may be formed between the bit line BL and the discharge voltage terminal Vdis. The third discharge path D_c may be formed based on operations of the switches P2 and P3 that might not be operated in applying the reverse current RVS.

The control circuit may enable the first local word line selection signal LXN controlled by the first sub-decoder SB1 and the inverted first global word line selection signal GXNB to a high level so that the first local word line switch N2 and the second discharge switch N3 may be turned-on. The inverted first global word line selection signal GXNB may be preset to be enabled in the discharge operation. Thus, a fourth discharge path D_d may be formed between the bit line BL and the discharge voltage terminal Vdis. The fourth discharge path D_d may be formed by the switches N2 and N3 that might not be operated in applying the reverse current RVS.

Hereinafter, a method of driving the memory cell that is connected between the hierarchical bit line structure and the hierarchical word line structure by the current-applying types will be illustrated in detail. For conveniences of explanations, the current that flows from the bit line BL to the word line may be defined as the forward current FWD, and the current that flows from the word line WL to the bit line BL may be defined as the reverse current RVS, or vice versa.

Driving the Memory Cell in Accordance with the Applying of the Forward Current

<Driving of a Non-Selected Memory Cell: Idle>

Figure 6:
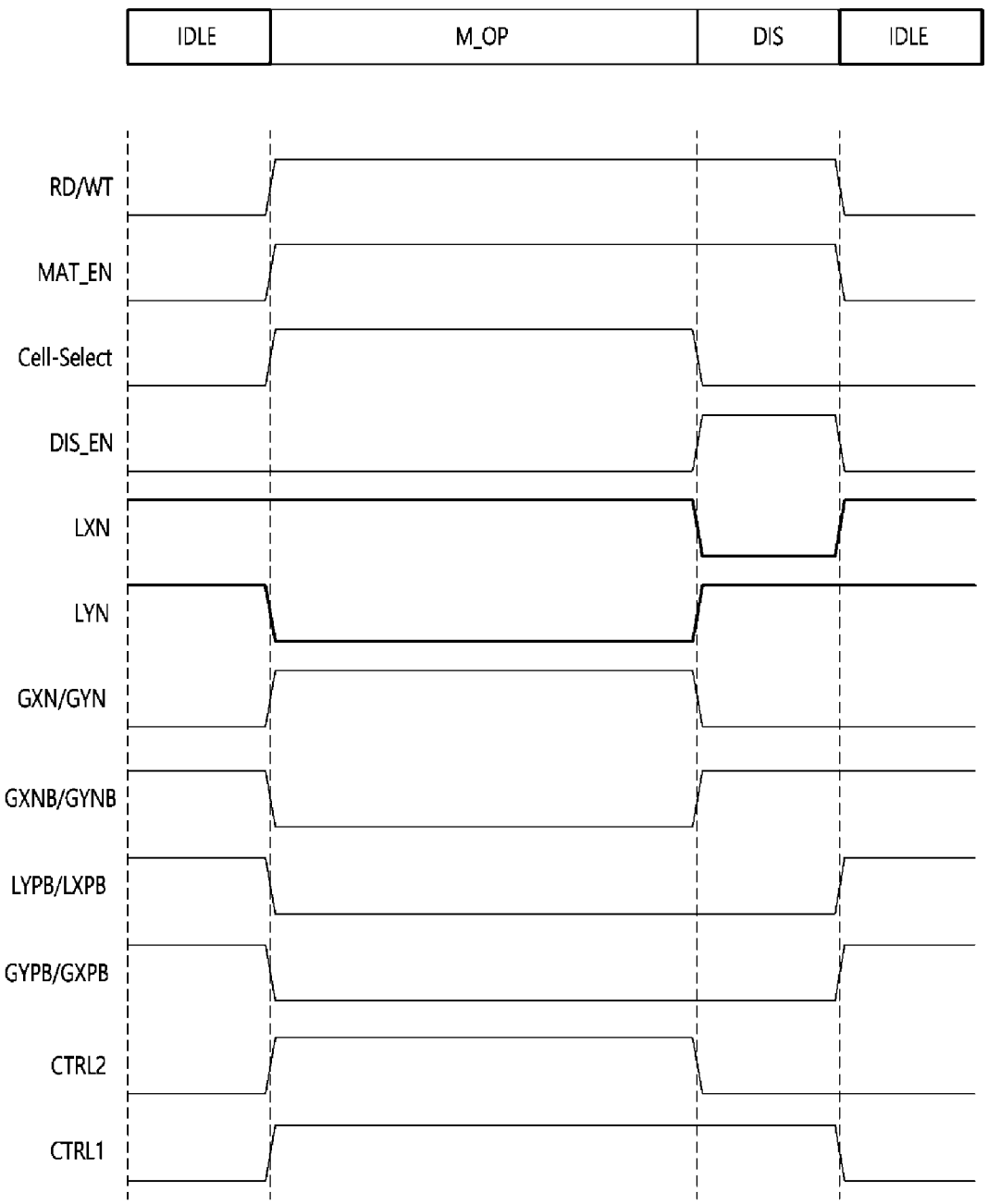
FIG. 6 is a voltage timing chart illustrating voltage levels of selection signals of a switch for applying a forward current to a memory cell of a variable resistive memory device in accordance with example embodiments.
Figure 7:
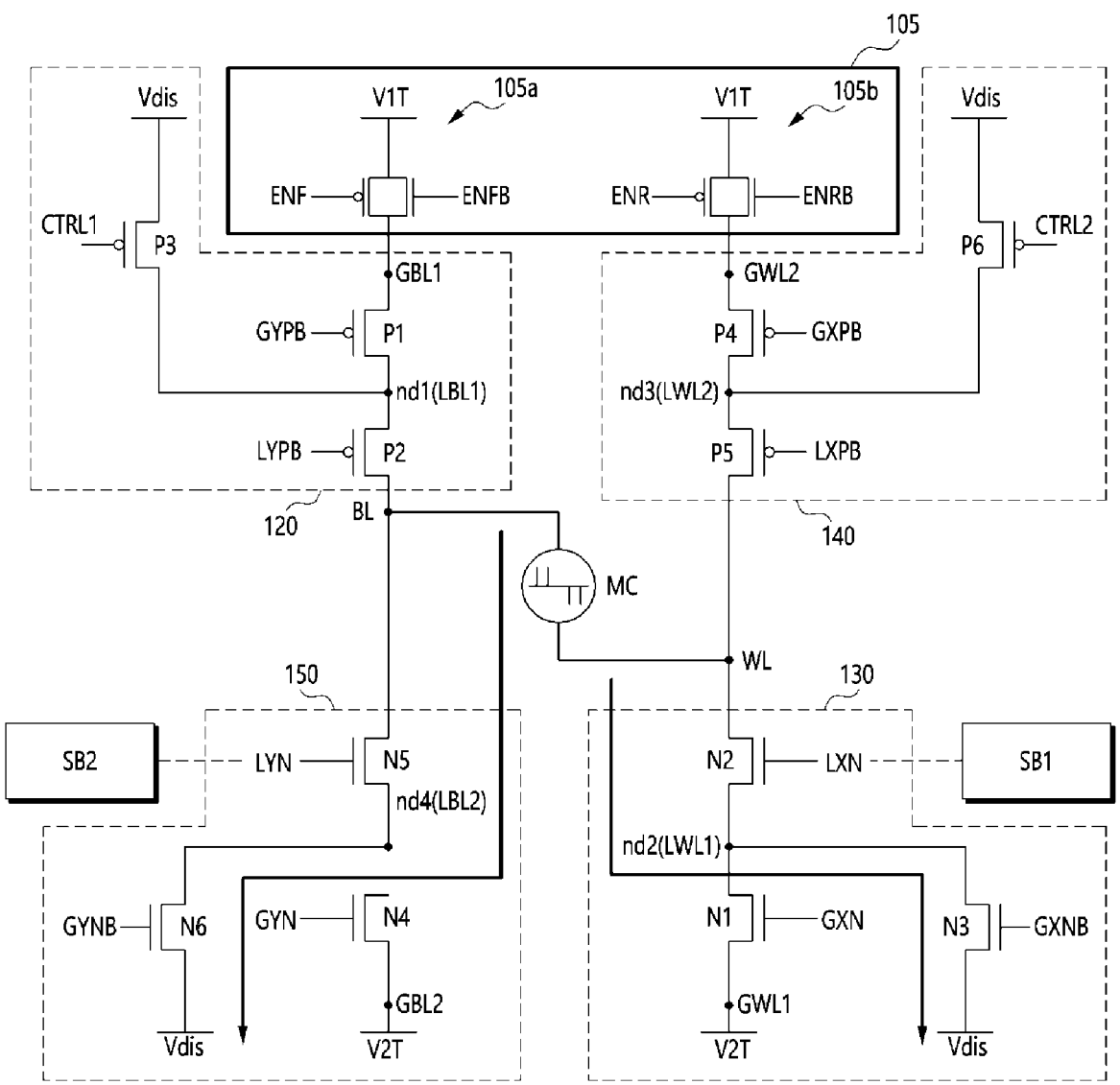
FIG. 7 is a circuit diagram illustrating a non-selected state of a memory cell in a variable resistive memory device in accordance with example embodiments.

FIG. 6 is a voltage timing chart illustrating voltage levels of selection signals of a switch for applying a forward current to a memory cell of a variable resistive memory device in accordance with example embodiments, and FIG. 7 is a circuit diagram illustrating a non-selected state of a memory cell in a variable resistive memory device in accordance with example embodiments.

Referring to FIGS. 6 and 7, when at least one of a mat enable signal MAT_EN and a cell selection signal Cell_Select are disabled, a corresponding memory cell MC might not be turned-on. That is, a memory operation might not be performed in the corresponding memory cell MC.

A read/write enable signal RD/WT may be used for determining the kind of memory operation.

The mat enable signal MAT_EN may be a mat selection signal. The mat selection signal may be generated from the control circuit based on an address command that is provided from the controller. The mat enable signal MAT_EN may be generated in substantially the same manner as for generating a general mat enable signal of a DRAM or a PCRAM.

The cell selection signal Cell_Select may be obtained by combining a row address with a column address. In example embodiments, the cell selection signal Cell_Select may be used for determining whether the memory cell MC in a specific address is turned-on or not.

A discharge enable signal DIS_EN may be enabled when the cell selection signal Cell_Select is disabled. A signal for enabling the switches in the first discharge block 165a may be output in response to the discharge enable signal DIS_EN.

Further, the read/write enable signal RD/WT, the mat enable signal MAT_EN, the cell selection signal Cell_Select, and the discharge enable signal DIS_EN may be generated from the control circuit. The control circuit may generate the read/write enable signal RD/WT, the mat enable signal MAT_EN, the cell selection signal Cell_Select, and the discharge enable signal DIS_EN based on the control command that is provided from the controller.

When the voltage that is applied to the bit line BL is substantially the same as the voltage that is applied to the word line WL, or when the voltage difference between the bit line BL and the word line WL is below the threshold voltage Vth, the memory cell MC might not be turned-on.

The control circuit of the variable resistive memory device 100 may enable the inverted second global bit line selection signal GYNB and the second local bit line selection signal LYN to a high level so that a specific memory cell MC might not be selected. The fourth discharge switch N6 and the second local bit line switch N5 in the second hierarchical bit line structure 150 may be turned-on to transmit a ground voltage that corresponds to a discharge voltage to the bit line BL.

Further, the inverted first global word line selection signal GXNB and the first local word line selection signal LXN may be enabled to a high level so that the second discharge switch N3 and the first local word line switch N2 in the first hierarchical word line structure 130 may be turned-on. Thus, the ground voltage may then be applied to the word line WL. As a result, the voltage of the bit line BL may be substantially the same as the voltage of the word line WL so that the memory cell MC may be converted to an idle state.

Alternatively, the first discharge switch P3 and the first local bit line switch P2 in the first hierarchical bit line structure 120 may be turned-on to apply the ground voltage to the bit line BL, thereby providing the memory cell MC with an idle state. Simultaneously, the third discharge switch P6 and the second local word line switch P5 in the second hierarchical word line structure 140 may be turned-on to apply the ground voltage to the word line WL.

However, because the operational speed of the NMOS transistor may be faster than the operational speed of the NMOS transistor, the fourth discharge switch N6, the second local bit line switch N5, the first local line switch N2, and the second discharge switch N3 including the NMOS transistors may be turned-on to provide the memory cell MC with an idle state so that the variable resistive memory device 100 may have improved operational speed.

Further, the first voltage V1 or the second voltage V2 may be applied to the bit line BL and the word line WL. However, the voltage may cause the deterioration of the switches. Thus, it may be advantageous to use the stable discharge path.

<Driving a Selected Memory Cell: M_OP>

Figure 8:
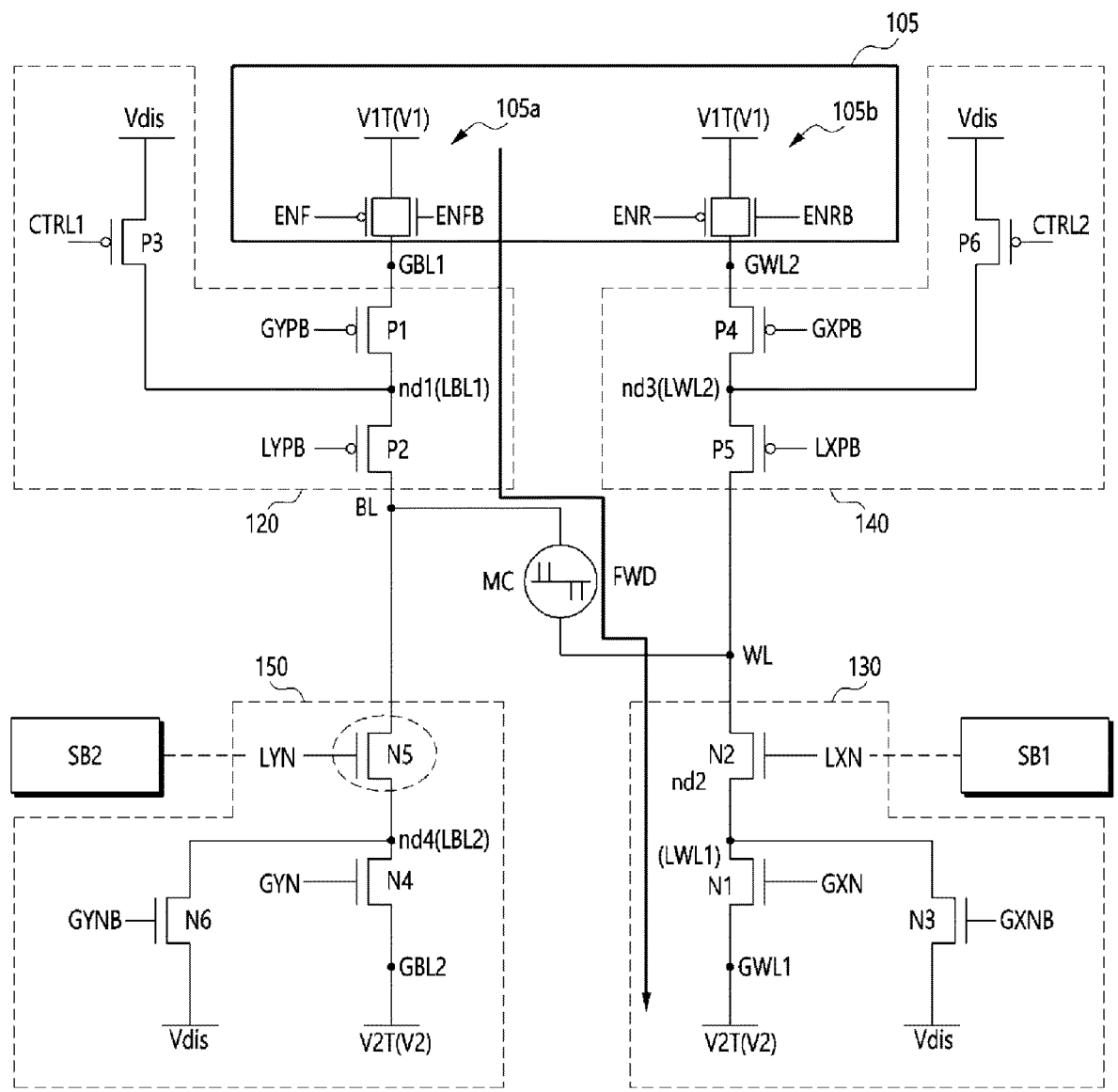
FIG. 8 is a circuit diagram illustrating operations for applying a forward current to a selected memory cell of a variable resistive memory device in accordance with example embodiments.

FIG. 8 is a circuit diagram illustrating operations for applying a forward current to a selected memory cell of a variable resistive memory device in accordance with example embodiments.

Referring to FIGS. 6 and 8, when the read/write enable signal RD/WT, the mat enable signal MAT_EN, and the cell selection signal Cell_Select are enabled and the discharge enable signal DIS_EN is disabled, the memory cell MC of a specific address in a specific mat may be selected so that the memory cell MC may enter into a memory operation section M_OP.

In the forward current-applying mode, the forward determining unit 105a of the mode setting circuit 105 may transmit the first voltage V1 to the first global bit line GBL1 in response to the forward enable signal ENF. As mentioned above, the first voltage V1 may be provided from the first voltage terminal V1T. Further, the forward enable signal ENF may be generated from the control circuit based on the direction command that is provided from the controller.

In order to provide the selected memory cell MC with the forward current FWD by the first voltage V1, the control circuit may output the first global bit line selection signal GYPB and the first local bit line selection signal LYPB that are enabled to a low level. Thus, the first global bit line switch P1 and the first local bit line switch P2 may be turned-on so that the first voltage V1 that is transmitted to the first global bit line GBL1 may be transmitted to the bit line BL through the first local bit line LBL1.

In the forward current-applying mode, the control circuit may output the first local word line selection signal LXN and the first global word line selection signal GXN that are enabled to a high level. Thus, the first local word line switch N2 and the first global word line switch N1 may be turned-on so that an electric potential of the word line WL may be pulled down to the first global word line GWL1 to which the second voltage V2 are provided.

Because the first voltage V1 may be higher than the second voltage V2 by greater than the threshold voltage Vth, the voltage difference, which is greater than the threshold voltage, may be generated between the bit line BL and the word line WL so that the memory cell MC may be turned-on. Thus, because the electric potential of the bit line BL may be higher than the electric potential of the word line WL, the forward current FWD may flow from the bit line BL to the word line WL to perform the memory operation of the memory cell MC.

The memory operation may be classified into a set state, a reset state and a read state in accordance with the levels and the applying types of the first and second voltages V1 and V2.

Referring to FIG. 6, the first global bit line selection signal GYPB and the second global word line selection signal GXPB may have substantially the same signal level. Further, the second local bit line selection signal LYPB and the second local word line selection signal LXPB may have substantially the same signal level. Thus, the turn-on condition may be provided to the second global word line switch P4 and the second local word line switch P5 together with the first global bit line switch P1 and the first local bit line switch P2. However, because the reverse determining unit 105b of the mode setting circuit 105 might not be driven, the second hierarchical word line structure 140 may be in a floating state.

Further, the second global word line selection signal GXN and the second global bit line selection signal GYN may have substantially the same level. In contrast, according to example embodiments, the forward current path may be generated by individually controlling the second local bit line selection signal LYN and the second local word line selection signal LXN. Therefore, the second local bit line selection signal LYN and the second local word line selection signal LXN may be individually controlled by the first sub-decoder SB1 and the second sub-decoder SB2 to selectively generate the forward current path.

The first sub-decoder SB1 may disable the second local bit line selection signal GYN to a low level to block the conductive path of the second hierarchical bit line structure 150. The second sub-decoder SB2 may enable the second local word line selection signal GXN to a high level to form the conductive path in the second hierarchical word line structure 130.

Therefore, the forward current FWD may flow from the first hierarchical bit line structure 120 to the second hierarchical word line structure 130 through the memory cell MC to perform the memory operation of the memory cell MC.

The first to fourth discharge switches P3, N3, P6 and N6 may be turned-off by disabling the discharge enable signal DIS_EN.

<Discharge Drive of a Selected Memory Cell: DIS>

Figure 9:
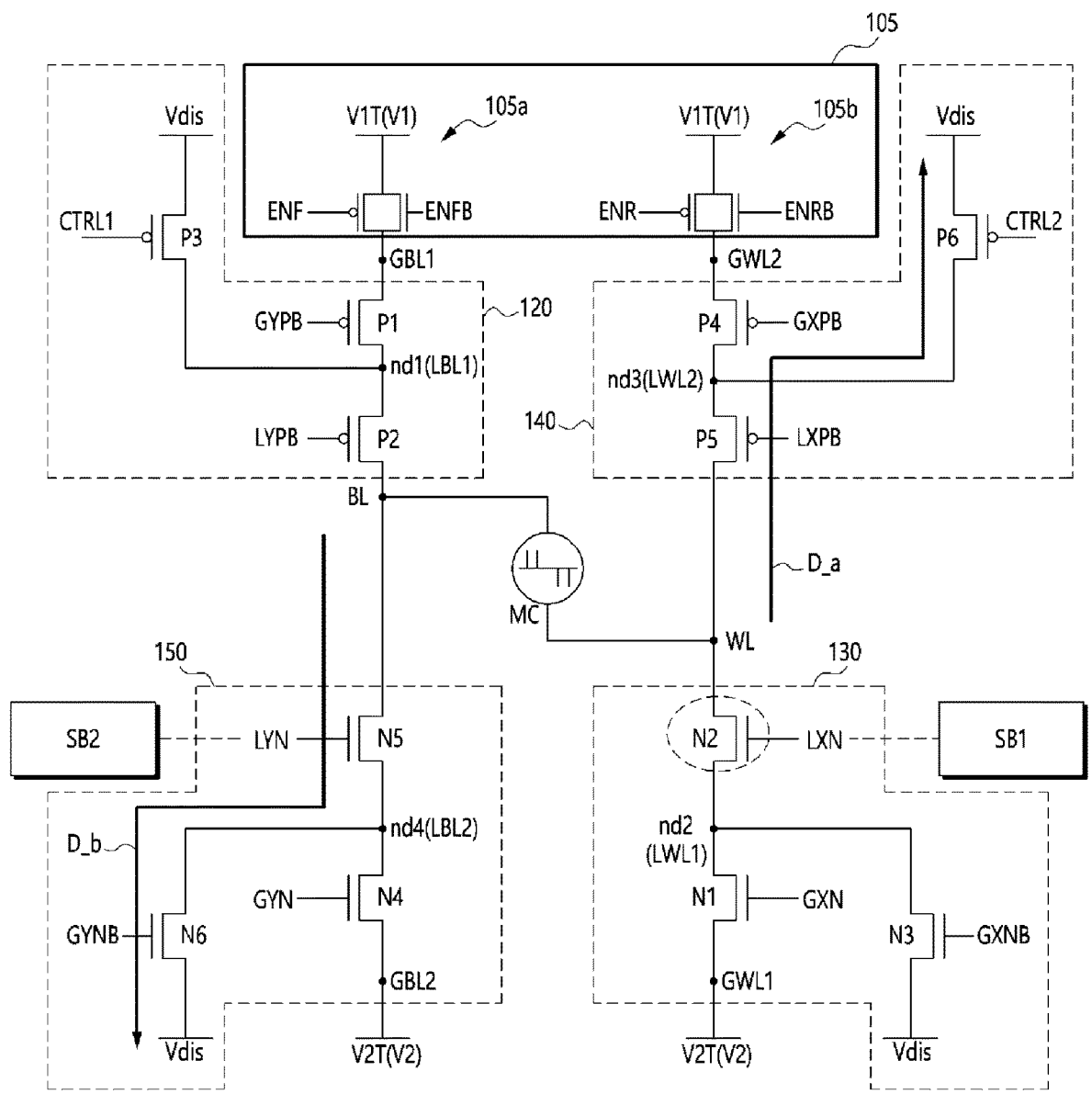
FIG. 9 is a circuit diagram illustrating a discharge operation of a memory cell of a variable resistive memory device, on which a memory operation is performed by using a forward current, in accordance with example embodiments.

FIG. 9 is a circuit diagram illustrating a discharge operation of a memory cell of a variable resistive memory device, on which a memory operation is performed by using a forward current, in accordance with example embodiments.

Referring to FIGS. 6 and 9, when the memory operation with the forward current FWD (i.e., the memory operation section M_OP) is completed, the cell selection signal Cell_Select may be disabled to a low level with the read/write enable signal RD/WT and the mat enable signal MAT_EN being enabled to a high level. The discharge enable signal DIS_EN may be enabled in response to the cell selection signal Cell_Select being disabled.

The residual voltage in the bit line BL and the word line WL may be discharged through the discharge terminal Vdis by enabling the discharge enable signal DIS_EN.

Because the previous step may be performing the memory operation with the forward current FWD, when the discharge enable signal DIS_EN is enabled, the first control signal CTRL1 may be disabled and the second control signal CTRL2 and the second local word line selection signal LXPB may be enabled to a low level. Thus, the third discharge switch P6 and the second local word line switch P5 in the second hierarchical word line structure 140 may be turned-on to form the first discharge path D_a in the second hierarchical word line structure 140. As a result, the residual voltage of the word line WL may be discharged through the first discharge path D_a.

Further, when the discharge enable signal DIS_EN is enabled, the second local bit line selection signal LYN and the inverted second global bit line selection signal GYNB may be enabled to a high level and the second global bit line selection signal GYN may be disabled to a low level to form the second discharge path D_b in the second hierarchical bit line structure 150. Thus, the residual voltage of the bit line BL may be discharged through the second discharge path D_b.

All the discharge switches that are connected to the selected bit line and the selected word line in the general bi-directional current-driven type variable resistive memory device may be driven.

In contrast, the first and third discharge switches P3 and P6 of example embodiments might not receive the inverted first global bit line selection signal GYPB and the inverted second global word line selection signal GXPB. The first and third discharge switches P3 and P6 may be individually controlled by the first and second control signals CTRL1 and CTRL2 so that the first and third discharge switches P3 and P6 may be selectively driven.

Thus, the control circuit of example embodiments may selectively enable the control signals CTRL2, LXPB, LYN, and GYNB to form the discharge paths D_a and D_b in the second hierarchical word line structure 140 and the second hierarchical bit line structure 150 to prevent the switches P1, P2, N2, and N2 that transmit the forward current FWD from being continuously operated.

As a result, the applying direction of the current and the discharge direction may be alternately changed to improve the reliability of the switch.

Driving a Memory Cell in Accordance with a Reverse Current-Applying type

<Driving a Non-Selected Memory Cell: Idle>

The voltage difference between the bit line BL and the word line WL may be maintained, the voltage difference being less than or equal to the threshold voltage to prevent any current from flowing through an idle memory cell MC in accordance with the reverse current-applying type, similarly to the idle memory cell in accordance with the forward current-applying type in FIG. 7. Thus, the memory cell MC may be converted to an idle state in a similar manner as those applied to the memory cell in FIG. 7 so that any further illustrations with respect to the manners will be omitted herein for brevity.

<Driving a Selected Memory Cell: M_OP>

Figure 10:
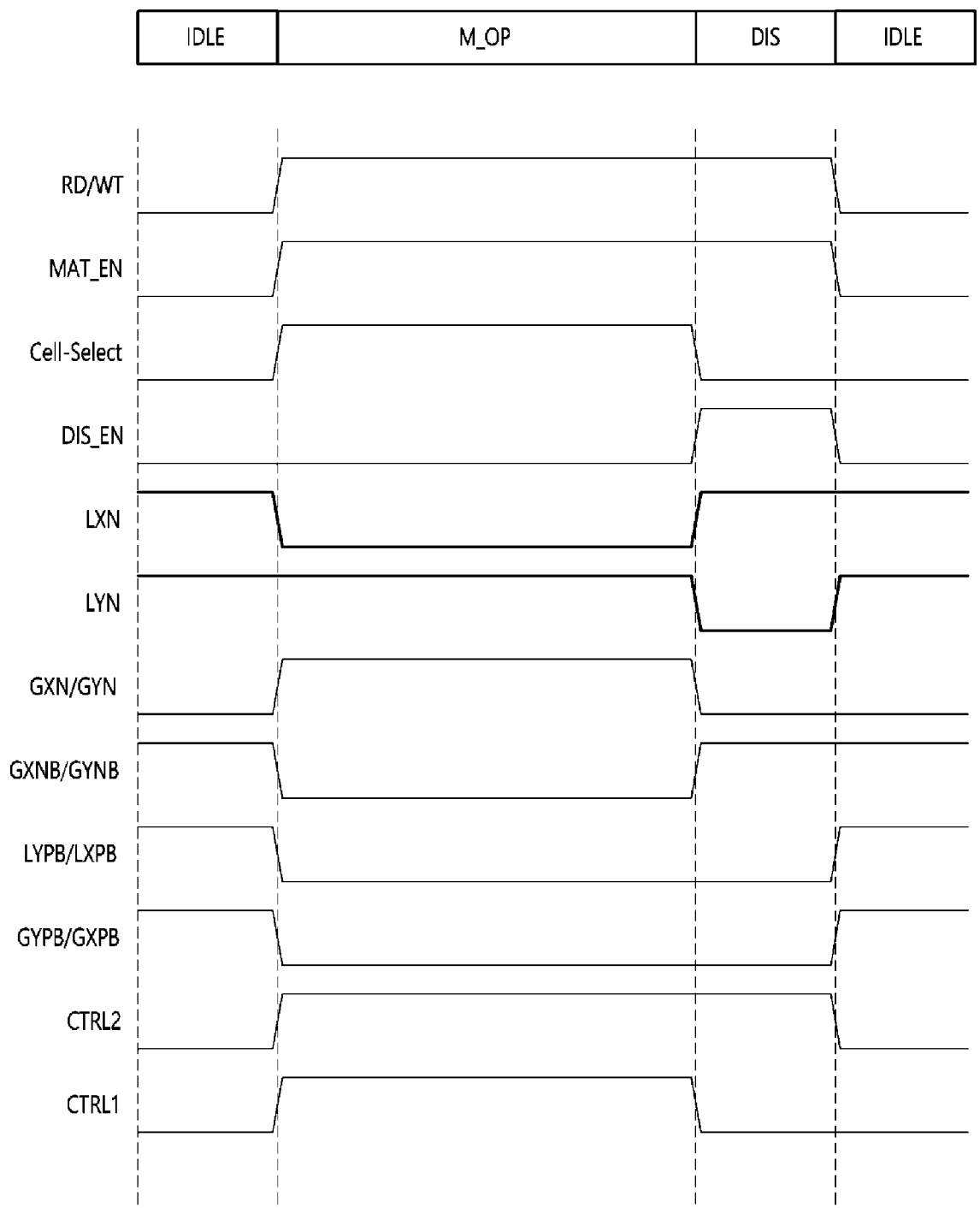
FIG. 10 is a voltage timing chart illustrating voltage levels of selection signals of a switch for applying a reverse current to a memory cell of a variable resistive memory device in accordance with example embodiments.
Figure 11:
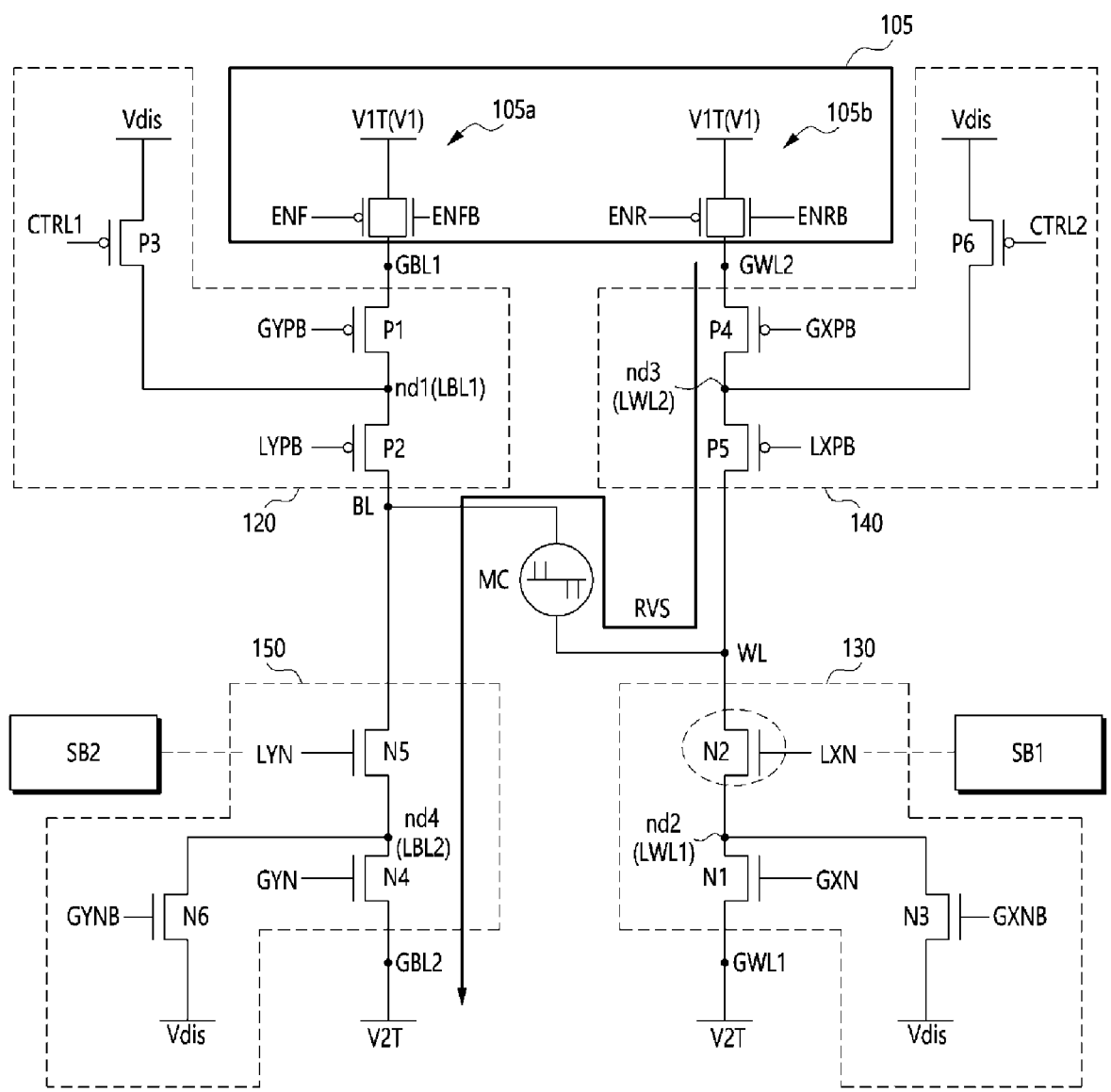
FIG. 11 is a circuit diagram illustrating operations for applying a reverse current to a selected memory cell of a variable resistive memory device in accordance with example embodiments.

FIG. 10 is a voltage timing chart illustrating voltage levels of selection signals of a switch for applying a reverse current to a memory cell of a variable resistive memory device in accordance with example embodiments, and FIG. 11 is a circuit diagram illustrating operations for applying a reverse current to a selected memory cell of a variable resistive memory device in accordance with example embodiments.

Referring to FIGS. 10 and 11, when the read/write enable signal RD/WT, the mat enable signal MAT_EN, and the cell selection signal Cell_Select are enabled to a high level, the discharge enable signal DIS_EN may be disabled to a low level. Thus, all the discharge switches P3, N3, P6, and N6 that are connected to the memory cell MC in a specific address of a specific mat may be turned-off.

In the reverse current-applying mode, the reverse determining unit 105b of the mode setting circuit 105 may apply the first voltage V1 to the second global word line GWL2 in response to the reverse enable signal ENR. The reverse enable signal ENR may have a level that is inverse to the level of the forward enable signal ENF.

In order to provide the selected memory cell MC with the reverse current RVS, the control circuit may output the second global word line selection signal GXPB and the second local word line selection signal LXPB that are enabled to a low level. Thus, the second global word line switch P4 and the second local word line switch P5 may be turned-on so that the first voltage V1 may be transmitted to the word line WL.

The control circuit may output the second local bit line selection signal LYN and the second global bit line selection signal GYN that are enabled to a high level to form the current path in the second hierarchical bit line structure 150.

Thus, the second local bit line switch N5 and the second global bit line switch N6 may be turned-on. The voltage of the bit line BL may be pulled down to the second global bit line GBL2 to which the second voltage V2 with the negative level may be provided. Because the first voltage V1 that is applied to the word line WL may be higher than the second voltage V2 that is applied to the word line WL by greater than the threshold voltage Vth, the memory cell MC may be turned-on to form the conductive path in the memory cell MC. As a result, the reverse current RVS may flow from the second hierarchical word line structure 140 to the second hierarchical bit line structure 150. That is, the memory cell MC may perform the memory operation by using the reverse current RVS that flows from the word line WL to the bit line BL.

Referring to FIG. 10, the first global bit line selection signal GYPB and the first local bit line selection signal LYPB that control the switches P1 and P2 of the first hierarchical bit line structure 120 may have a level that is substantially the same as that of the first global word line selection signal GXPB and the second global bit line selection signal GYPB. Thus, the first global bit line switch P1 and the first local bit line switch P2 may be turned-on. However, because the forward determining unit 105a of the mode setting circuit 105 might not be driven, the first hierarchical bit line structure 120 may be in a floating state.

In the memory operation section M_OP, the first sub-decoder SB1 may output the second local word line selection signal LXN with a level that is opposite to the level of the second local bit line selection signal LYN that is output from the first sub-decoder SB2. As a result, no current path may be formed in the first hierarchical word line structure 130.

<Discharge Drive of a Selected Memory Cell: DIS>

Figure 12:
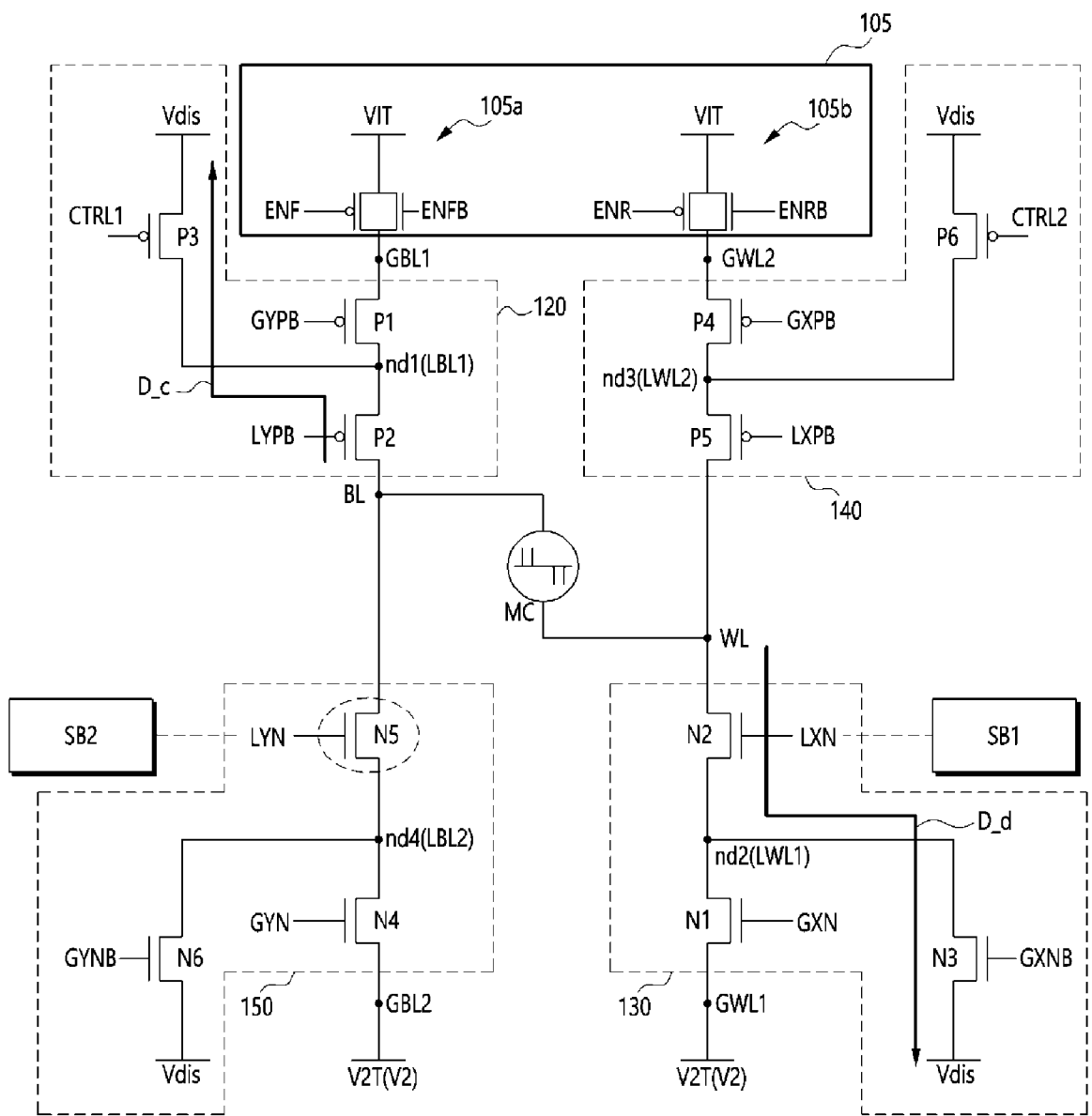
FIG. 12 is a circuit diagram illustrating a discharge operation of a memory cell of a variable resistive memory device, on which a memory operation is performed by using a reverse current, in accordance with example embodiments.

FIG. 12 is a circuit diagram illustrating a discharge operation of a memory cell of a variable resistive memory device, on which a memory operation is performed by using a forward current, in accordance with example embodiments.

Referring to FIGS. 10 and 12, when the memory operation with the reverse current RVS (i.e., the memory operation section M_OP) is completed, the cell selection signal Cell_Select may be disabled to a low level with the read/write enable signal RD/WT and the mat enable signal MAT_EN being enabled to a high level. The discharge enable signal DIS_EN may be enabled in response to the disabled cell selection signal Cell_Select.

The residual voltage in the bit line BL and the word line WL may be discharged through the discharge terminal Vdis by enabling the discharge enable signal DIS_EN.

Because the previous step may be performing the memory operation with the reverse current RVS, the variable resistive memory device 100 might not operate the switch on the path of the reverse current RVS. The residual voltage in the bit line BL and the word line WL may be preferably discharged through another current path.

That is, when the discharge enable signal DIS_EN is enabled, the first control signal CTRL1 and the first local bit line selection signal LYPB may be enabled to a low level. Thus, the first discharge switch P3 and the first local bit line switch P2 may be turned-on to form the third discharge path D_c in the first hierarchical bit line structure 120. As a result, the residual voltage of the bit line BL may be discharged through the third discharge path D_c.

Further, when the discharge enable signal DIS_EN is enabled, the first local word line selection signal LXN and the word line discharge signal GXNB may be enabled to a high level. Thus, the first local word line switch N2 and the second discharge switch N3 may be turned-on to form the fourth discharge path D_d in the first hierarchical word line structure 130. Thus, the residual voltage of the word line WL may be discharged to the discharge terminal Vdis through the fourth discharge path D_d.

When the first control signal CTRL1 is enabled, the first sub-decoder SB1 may output the enabled second local word line selection signal LXN so that the second control signal CTRL2 and the second local bit line selection signal LYN that are output from the second sub-decoder SB2 may be disabled. As a result, the discharge path might not be formed in the second hierarchical word line structure 140 and the second hierarchical bit line structure 150 through which the reverse current RVS may flow.

Therefore, the continuous operations of the switches may be prevented to decrease the stress on the switches.

According to example embodiments, the memory operation and the discharge operation of the bi-directional memory cell may be performed by the memory cell with a decreasing number of discharge switches and sub-decoders that control the current direction of the memory cell. Thus, an area of the memory cell and an area of the control circuit for driving the memory cell may also be reduced to decrease the total area of the mat.

Further, the type of discharge switches in the first and second hierarchical bit line structures and the first and second hierarchical word line structures may be substantially the same as that of the global/local bit line switches and the global/local word line switches. Thus, the area of a contact region in the memory cell may also be reduced.

Furthermore, in the structures of example embodiments, shown in FIGS. 7, 8, 9, 11, and 12, the first and second hierarchical bit line structures 120 and 150 and the first and second hierarchical word line structures 130 and 140 may have a rail shape. Alternatively, the first and second hierarchical bit line structures 120 and 150 and the first and second hierarchical word line structures 130 and 140 may be vertically arranged.

Figure 13:
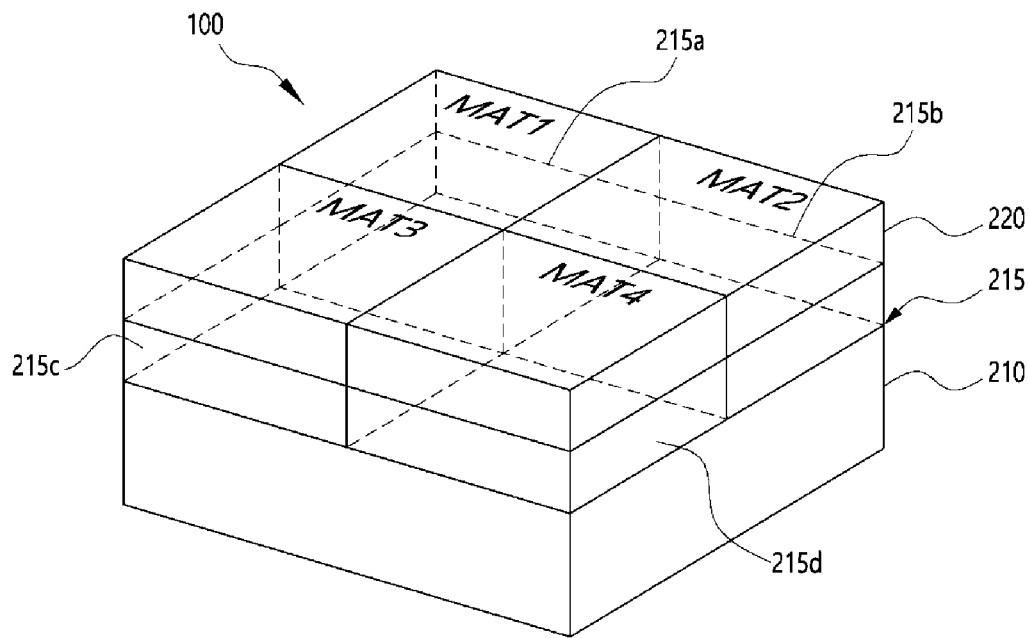
FIG. 13 is a perspective view illustrating a variable resistive memory device with a plurality of mats in accordance with example embodiments.
Figure 14:
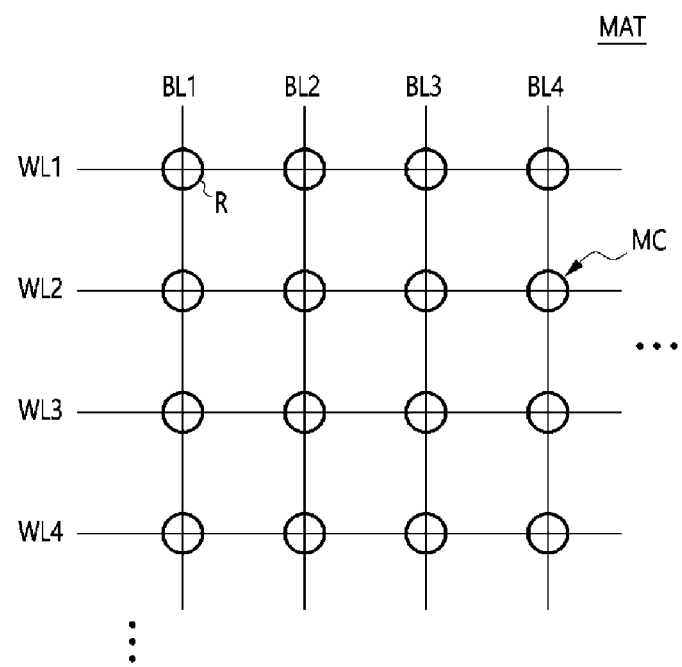
FIG. 14 is a view illustrating an arrangement of memory cells in accordance with example embodiments.

FIG. 13 is a perspective view illustrating a variable resistive memory device with a plurality of mats in accordance with example embodiments, and FIG. 14 is a view illustrating an arrangement of memory cells in accordance with example embodiments.

Referring to FIG. 13, the variable resistive memory device 100 of example embodiments may include a mat layer 220 that is arranged over a semiconductor substrate 210. For example, the mat layer 220 may include a plurality of mats MAT1~MAT4.

A control circuit 215 may be arranged between the semiconductor substrate 210 and the mat layer 220. Control signal generators for controlling the switches P1~P6 and N1~N6 may be formed at the control circuit 215. Further, the control circuit 215 may generate the forward enable signal ENF, the reverse enable signal ENR and the discharge control signals CTRL1 and CTRL2 based on the direction command DIR that is provided from the controller. As mentioned above, the control circuit 215 may include the first and second sub-decoders SB1 and SB2 for controlling the second local word line selection signal LXN and the second local bit line selection signal LYN to generate the forward current path, the reverse current path, and the discharge paths through the current paths. Additionally, various control circuits, such as a voltage generation circuit, a sense amplifier, etc., as well as the elements in the hierarchical bit line structures, and the hierarchical word line structures may be arranged in the control circuit 215.

The control circuit 215 may be classified into first to four control circuit regions 215a, 215b, 215c and 215d that correspond to the mats MAT1~MAT4. For example, the first control circuit region 215a may control the memory cells MC in the first mat MAT1.

As shown in FIG. 14, each of the mats MAT1~MAT4 may include a plurality of word lines WL1~WL4, a plurality of bit lines BL1~BL4, and a memory cell MC. The memory cell MC may include the resistive layer R, portions of the bit line that are over and under the resistive layer R and portions of the word line that are over and under the resistive layer R as electrodes. In example embodiments, the hierarchical bit line structures 120 and 150 and the hierarchical word line structures 130 and 140 may be arranged in the rail shape. Alternatively, the word lines WL1~WL4 and the bit lines BL1~BL4 may intersect with each other.

Each of the mats MAT1~MAT4 may include a single memory cell array layer with the word line WL, the memory cell MC, and the bit line BL. Alternatively, each of the mats MAT1~MAT4 may include a plurality of memory cell array layers. In this case, one level of the memory cell array may be referred to as a deck.

Figure 15A:
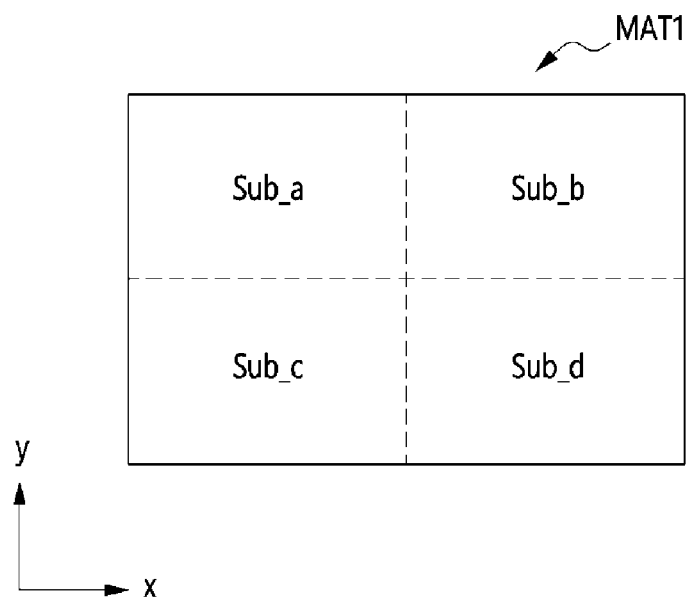
FIG. 15A is a plan view illustrating a mat in accordance with example embodiments.
Figure 15B:
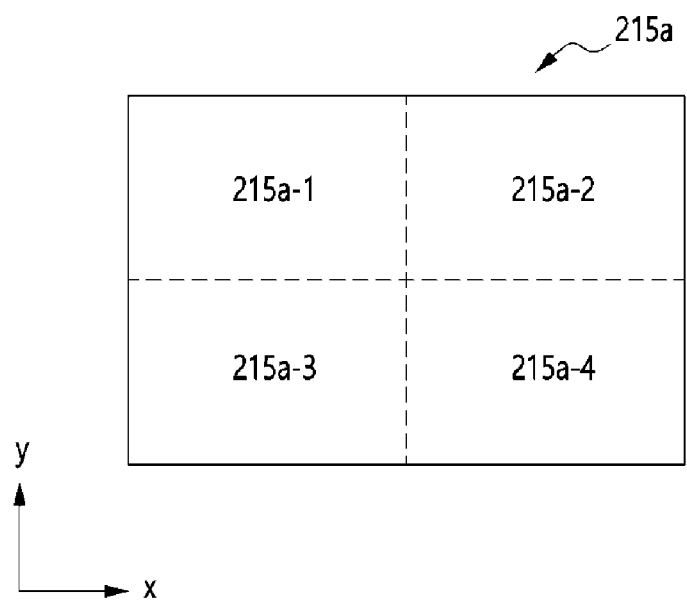
FIG. 15B is a plan view illustrating a control circuit in accordance with example embodiments.

FIG. 15A is a plan view illustrating a mat in accordance with example embodiments, and FIG. 15B is a plan view illustrating a control circuit in accordance with example embodiments. Each of the mats and the control circuit region that corresponds to the mat may have substantially the same configuration, respectively. Thus, FIGS. 15A and 15B may show the first mat MAT1 and the first control circuit region 215a among the mats and the control circuit regions.

Referring to FIG. 15A, the mat may be classified into a plurality of sub-mats Sub_a~Sub_d. Particularly, the sub-mats Sub_a~Sub_d in the mat, corresponding to the memory cells MC, may be controlled. When the word line WL and the bit line BL are extended in widthwise and lengthwise directions of the mat without the classification of the sub-mats Sub_a~Sub_d, the lengths of the word line WL and the bit line BL may be so long that it increases signal delays. Thus, in order to effectively transmit signals to the memory cells MC, the sub-mats Sub_a~Sub_d in one mat MAT may be controlled.

Referring to FIG. 15B, the first control circuit region 215a may be classified into a plurality of sub-control circuit regions 215a-1~215a-4 that correspond to the sub-mats Sub_a~Sub_d. Each of the sub-control circuit regions 215a-1~215a-4 may control the memory cells MC that correspond to one of the sub-mats Sub_a~Sub_d. Further, each of the sub-control circuit regions 215a-1~215a-4 may control a part of the memory cells MC in the adjacent sub-mats Sub_a~Sub_d.

Figure 16:
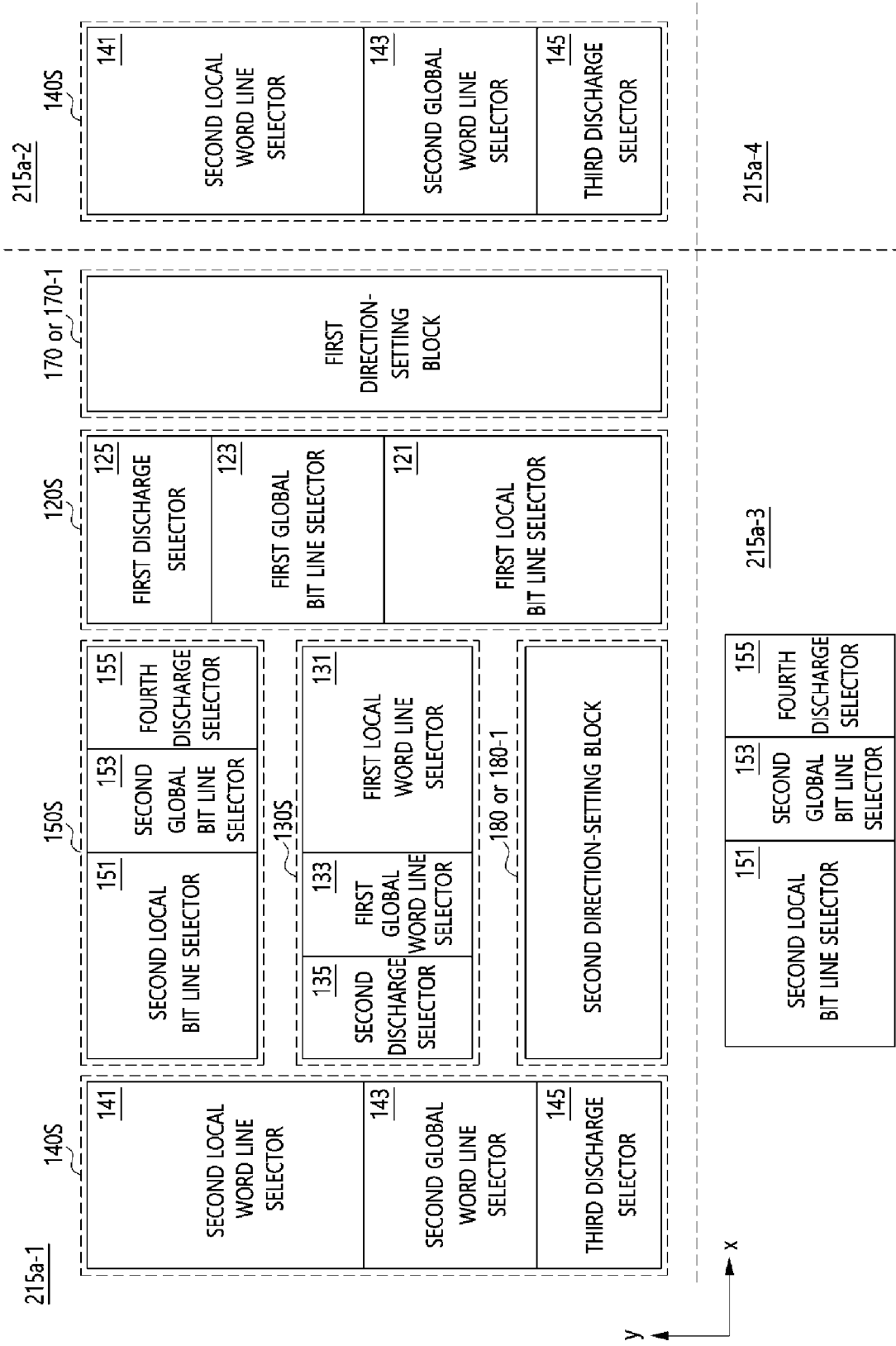
FIG. 16 is a view illustrating an architecture of a sub-control circuit region that corresponds to a sub-mat in accordance with example embodiments.

FIG. 16 is a view illustrating an architecture of a sub-control circuit region that corresponds to a sub-mat in accordance with example embodiments.

FIG. 16 may mainly show the first sub-control circuit region 215a-1 that corresponds to the first sub-mat Sub_a. In order to explain the relationship between the first sub-control circuit region 215a-1 and the adjacent sub-control circuit region, the adjacent sub-control circuit region may also be partially illustrated.

The first sub-control circuit region 215a-1 may include a first hierarchical bit line block 120S, a first hierarchical word line block 130S, a second hierarchical word line block 140S, a second hierarchical bit line block 150S, a first direction-setting block 170 or 170-1, and a second direction-setting block 180 or 180-1.

The first hierarchical bit line block 120S may include a first local bit line selector 121, a first global bit line selector 123, and a first discharge selector 125.

The first local bit line selector 121 may be a region in which the first local bit line switches P2 for selectively connecting the first local bit line LBL1 with the bit line BL may be arranged. For example, the number of first local bit line switches P2 may correspond to the number of bit lines BL.

The first global bit line selector 123 may be a region in which the first global bit line switches P1 for selectively connecting the first global bit line GBL1 with the first local bit lines LBL1 may be arranged. For example, the number of first global bit line switches P1 may correspond to the number of first local bit lines LBL1.

The first discharge selector 125 may be a region in which the first discharge switches P3 that are connected between the discharge voltage terminal Vdis and the first connection node nd1 may be arranged. For example, the number of first discharge switches P3 may correspond to the number of first global bit lines GBL1 in the first sub-mat Sub_a.

The number of first global bit line GBL1, first local bit line LBL1 and bit line BL may be gradually increased in a decoding manner. Thus, the number of first local bit line switches P2 that correspond to the number of bit lines BL may be more than the number of first global bit line switches P1 and first discharge switches P3. Therefore, the first local bit line selector 121 may occupy most of a region of the first hierarchical bit line block 120S. The first global bit line selector 123 and the first discharge selector 125 may sequentially occupy the remaining region of the first hierarchical bit line block 120S.

In example embodiments, the first hierarchical bit line block 120S may be extended in a y-direction, not limited thereto. The switches that are integrated in the first hierarchical bit line block 120S, for example, transistors, may have a same type transistor, for example, a PMOS transistor. Thus, the first hierarchical bit line block 120S may include a single well, for example, an n well. Therefore, a space margin for forming different types of wells may be reduced. Further, the first direction-setting block 170 or 170-1 may include the mode setting circuit 105 configured to supply the first voltage V1 to the first global bit line GBL1 of the first hierarchical bit line block 120S. Thus, the first hierarchical bit line block 120S may be positioned to be adjacent to the first direction-setting block 170.

The first hierarchical word line block 130S may include a first local word line selector 131, a first global word line selector 133, and a second discharge selector 135.

The first local word line selector 131 may be a region in which the first local word line switches N2 for selectively connecting the first local word line LWL1 with the word line WL in the first sub-mat Sub_a may be arranged. For example, the number of first local word line switches N2 may correspond to the number of word lines WL.

The first global word line selector 133 may be a region in which the first global word line switches N1 for selectively connecting the first global word line GWL1 with the first local word lines LWL1 in the first sub-control circuit region 215a-1 may be arranged. For example, the number of first global word line switches N1 may correspond to the number of first local word lines LWL1.

The second discharge selector 135 may be a region in which the second discharge switches N3 that are connected between the discharge voltage terminal Vdis and the second connection node nd2 may be arranged. For example, the number of second discharge switches N3 may correspond to the number of first global word lines GWL1.

Therefore, the first local word line selector 131 may occupy most of a region of the first hierarchical word line block 130S. The first global word line selector 133 and the second discharge selector 135 may sequentially occupy the remaining region of the first hierarchical word line block 130S. In example embodiments, the first hierarchical word line block 130S may be extended in an x-direction, not limited thereto. The switches that are integrated in the first hierarchical word line block 130S may include an NMOS transistor. Thus, the first hierarchical word line block 130S may include a single p well.

A forward bias path may be formed between the first hierarchical bit line block 120S and the first hierarchical word line block 130S. Thus, the first local bit line selector 121 of the first hierarchical bit line block 120S may be positioned to be adjacent to the first local word line selector 131 of the first hierarchical word line block 130S in consideration of the design efficiencies of wirings.

The second hierarchical word line block 140S may include a second local word line selector 141, a second global word line selector 143, and a third discharge selector 145. The second hierarchical word line block 140S may be extended in the y-direction, similarly to the first hierarchical bit line block 120S. For example, the second hierarchical word line block 140S and the first hierarchical bit line block 120S may be located at both sides of the first hierarchical word line block 130S. Further, the second hierarchical word line block 140-S may be parallel to the first hierarchical bit line block 120S. As mentioned above, the second hierarchical word line block 140S may include the PMOS transistor configured to receive the first voltage V1 from the second global word line GWL2, thereby performing the pull-up operation.

In example embodiments, because the second hierarchical word line block 140S and the first hierarchical word line block 130S may include the different types transistors, the second hierarchical word line block 140S and the first hierarchical word line block 130S may be spaced apart from each other to reduce the generation of a parasitic element.

The second hierarchical bit line block 150S may be extended parallel to the first hierarchical word line block 130S. The second hierarchical bit line block 150S may be positioned between the first hierarchical bit line block 120S and the second hierarchical word line block 140S. The second hierarchical bit line block 150S may include a second local bit line selector 151, a second global bit line selector 153, and a fourth discharge selector 155. The second local bit line selector 151 may be positioned to be adjacent to the second local word line selector 141 to form the reverse current path in the second hierarchical bit line block 150S and the second hierarchical word line block 140S. Further, the switches in the second hierarchical bit line block 150S may include an NMOS transistor.

Therefore, the first hierarchical bit line block 120S and the second hierarchical word line block 140S with the PMOS transistors may be arranged in the y-direction. The second hierarchical bit line block 150S and the first hierarchical word line block 130S may be extended in the x-direction.

The first direction-setting block 170 or 170-1 may selectively provide the first hierarchical bit line block 120S that is extended in the y-direction and the second local word line block 140S to be adjacent to the first sub-control circuit region 215a-1 along the x-direction with the first voltage V1. For example, the first direction-setting block 170 may be positioned at one end of the first hierarchical bit line block 120S. Particularly, the first direction-setting block 170 may provide the first hierarchical bit line block 120S of the first sub-control circuit region 215a-1 and the second hierarchical word line block 140S of the second sub-control circuit region 215a-2 with the first voltage V1.

The second direction-setting block 180 or 180-1 may be positioned at one end of the first hierarchical word line block 130S that is extended in the x-direction. Particularly, the second direction-setting block 180 or 180-1 may provide the first hierarchical word line block 130S of the first sub-control circuit region 215a-1 and the second hierarchical bit line block 150S of the third sub-control circuit region 215a-3 with signals.

Figure 17:
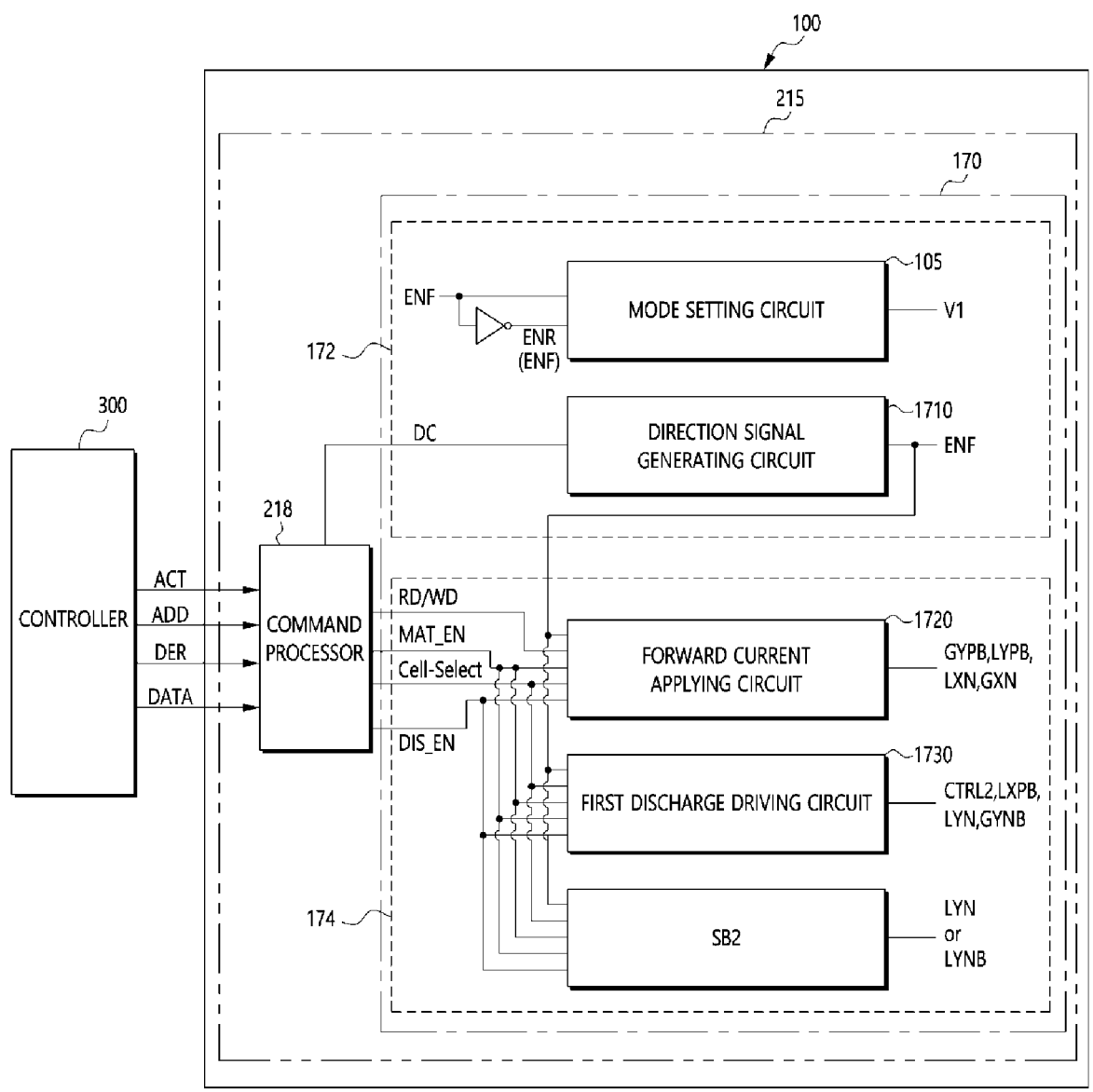
FIG. 17 is a block diagram illustrating a first direction-setting block in accordance with example embodiments.
Figure 18:
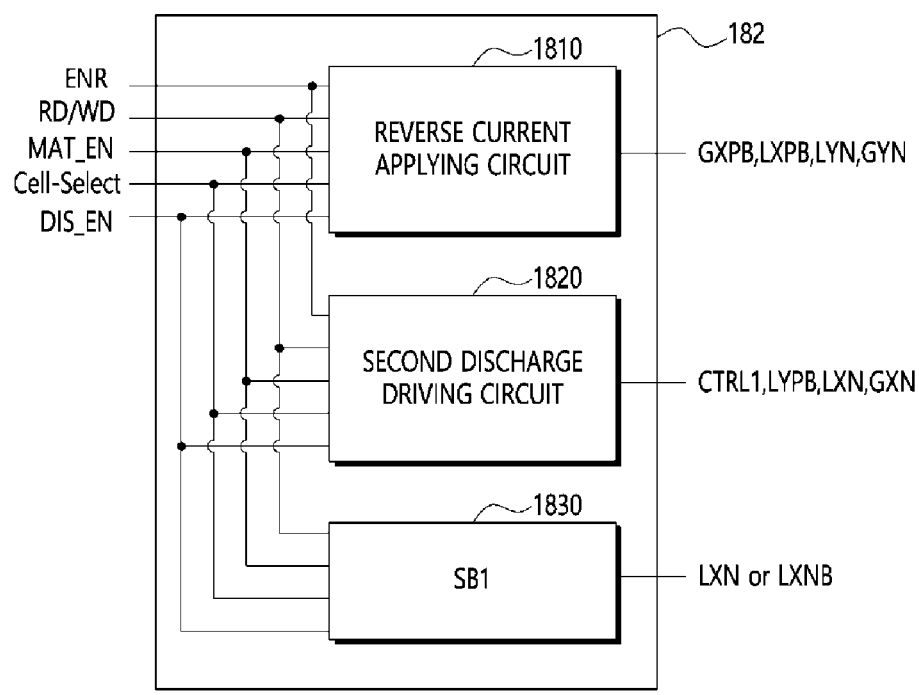
FIG. 18 is a block diagram illustrating a second direction-setting block in accordance with example embodiments.

FIG. 17 is a block diagram illustrating a first direction-setting block in accordance with example embodiments, and FIG. 18 is a block diagram illustrating a second direction-setting block in accordance with example embodiments.

Referring to FIG. 17, the first direction-setting block 170 may be positioned in the control circuit 215 of the variable resistive memory device 100. Particularly, the first direction-setting block 170 may be arranged in the sub-control circuit regions 215a~215d.

As mentioned above, the variable resistive memory device 100 may receive the control commands ACT, ADD, DIR, and DATA from the controller 300. The control circuit 215 of the variable resistive memory device 100 may include a command processor 218 for receiving the control commands ACT, ADD, DIR, and DATA to generate general control signals DC, RD/WD, MAT_EN, Cell_Select, and DIS_EN.

The command processor 218 may be substantially the same as command-processing circuits in a general memory device. The command processor 218 may receive the active command ACT, the address command ADD, the direction command DAR, and the data DATA to generate the mat selection signal MAT_EN and the cell selection signal Cell_select for designating the position of a selected cell, and the read/write enable signal RD/WT and the discharge enable signal DIS_EN related to the operations.

However, the command processor 218 of example embodiments may additionally receive the direction command DIR differently from the general phase change memory device. The command processor 218 may generate a direction control signal DC based on the direction command DIR.

For example, the direction control signal DC may have a level that is changed in response to the periodically input direction command DIR. The direction control signal DC may be processed by a direction signal generating circuit 1710 to generate the forward enable signal ENF or the reverse enable signal ENR. Alternatively, the direction control signal DC may be operated as the forward enable signal ENF or the reverse enable signal ENR.

For example, currents with the same direction may be applied to a specific memory cell for a critical number of times to generate the direction control signal DC, illustrated later.

The first direction-setting block 170 may include a direction controller 172 and a first control signal generator 174.

The direction controller 172 may include a direction signal generating circuit 1710 and a mode setting circuit 105.

The direction signal generating circuit 1710 may generate the forward enable signal ENF or the reverse enable signal ENR in response to the direction control signal DC. When the level of the direction control signal DC is changed in inputting the direction command DIR, the direction signal generating circuit 1710 may include a buffering circuit or a level shifter configured to control the voltage level for corresponding to an operational voltage level of the mode setting circuit 105.

The mode setting circuit 105 may output the first voltage V1 to any one of the first global bit line GBL1 and the second global word line GWL2 in response to the forward enable signal ENF and the reverse enable signal ENR. The mode setting circuit 105 may be illustrated in detail with reference to FIG. 3. Thus, any further illustrations with respect to the mode setting circuit 105 will be omitted herein for brevity.

The first control signal generator 174 may receive the basic control signals DC, RD/WT, MAT_EN, Cell-select, and DIS_EN to generate the control signals for a discharge operation (hereinafter referred to as a forward current discharge operation) after applying a control signal for applying the forward current FWD and the forward current FWD.

The first control signal generator 174 may include a forward current applying circuit 1720, a first discharge driving circuit 1730, and a second sub-decoder SB2.

The forward current applying circuit 1720 may receive the forward enable signal ENF, the read/write enable signal RD/WT, the mat selection signal MAT_EN, the cell selection signal Cell-Select, and the discharge enable signal DIS_EN. When the forward enable signal ENF, the read/write enable signal RD/WT, the mat selection signal MAT_EN, and the cell selection signal Cell-Select are enabled and the discharge enable signal DIS_EN is disabled, the forward current applying circuit 1720 may enable the first global bit line selection signal GYPB, the first local bit line selection signal LYPB, the first local word line selection signal LXN, and the first global word line selection signal GXN. The forward current applying circuit 1720 may include various logic combination circuits.

The first discharge driving circuit 1730 may receive the forward enable signal ENF, the read/write enable signal RD/WT, the mat selection signal MAT_EN, the cell selection signal Cell-Select, and the discharge enable signal DIS_EN. When the forward enable signal ENF, the read/write enable signal RD/WT, the mat selection signal MAT_EN, and the discharge enable signal DIS_EN are enabled and the cell selection signal Cell-Select is disabled, the first discharge driving circuit 1730 may enable the second control signal CTRL2, the second local word line selection signal LXPB, the second local bit line selection signal LYN, and the inverted second global bit line selection signal GYNB to discharge the residual voltages in the selected bit line BL and the selected word line WL.

Thus, the second local word line switch P5 and the third discharge switch P6 may be turned-on to form the first discharge path D_a between the word line WL and the discharge terminal Vdis. Further, the second local bit line switch N5 and the fourth discharge transistor N6 may be turned-on to form the second discharge path D_b between the bit line BL and the discharge terminal Vids. As a result, the residual voltage in the selected bit line may be discharged to the discharge terminal Vdis through the second discharge path D_b.

The second sub-decoder SB2 may generate the second local bit line selection signal LYN of the second hierarchical bit line structure 150. That is, when the forward enable signal ENF, the read/write enable signal RD/WT, the mat selection signal MAT_EN, and the cell selection signal Cell-Select are enabled and the discharge enable signal DIS_EN is disabled, that is, when applying the forward current, the second sub-decoder SB2 may disable the second local bit line selection signal LYB to a low level. In FIGS, the second local bit line selection signal LYN that is disabled to a low level may be represented by "LYNB". Thus, the generation of the conductive path in the second hierarchical bit line structure 150 may be blocked. When the forward enable signal ENF, the read/write enable signal RD/WT, the mat selection signal MAT_EN, and the discharge enable signal DI_EN are enabled and the cell selection signal Cell-Select is disabled, that is, when discharging after applying the forward current, the second sub-decoder SB2 may enable the second local bit line selection signal LYB to a high level. Thus, the second discharge path D_b may be formed in the second hierarchical bit line structure 150. That is, the second sub-decoder SB2 of example embodiments may individually control the second local bit line selection signal LYN and the second global bit line selection signal GYN.

Referring to FIG. 18, the second direction-setting block 180 may include a second control signal generator 182. The second control signal generator 182 may include a reverse current applying circuit 1810, a second discharge driving circuit 1820, and a first sub-decoder SB1.

The reverse current applying circuit 1810 may receive the reverse enable signal ENR that is provided from the direction controller 172 in FIG. 17, the read/write enable signal RD/WT, the mat selection signal MAT_EN, the cell selection signal Cell-Select, and the discharge enable signal DIS_EN. The reverse determining unit 105b of the mode setting circuit 105 may apply the first voltage V1 to the second global word line GWL2 in response to the reverse enable signal ENR. The reverse enable signal ENR may be formed by inverting the forward enable signal ENF.

In example embodiments, the direction controller 172 may be provided to the first direction-setting block 170. Alternatively, the direction controller 172 may be provided to the second direction-setting block 180. In this case, an output signal from the direction controller 172 may be provided to the first direction-setting block 170.

When the reverse enable signal ENR, the read/write enable signal RD/WT, the mat selection signal MAT_EN, and the cell selection signal Cell-Select are enabled and the discharge enable signal DIS_EN is disabled, the reverse current applying circuit 1810 may enable the second global word line selection signal GXPB, the second local word line selection signal LXPB, the second local bit line selection signal LYN, and the second global bit line selection signal GYN. The reverse current applying circuit 1810 may disable other signals.

The second discharge driving circuit 1820 may receive the reverse enable signal ENR, the read/write enable signal RD/WT, the mat selection signal MAT_EN, the cell selection signal Cell-Select, and the discharge enable signal DIS_EN. When the reverse enable signal ENR, the read/write enable signal RD/WT, the mat selection signal MAT_EN, and the discharge enable signal DIS_EN are enabled and the cell selection signal Cell-Select is disabled, that is, when applying the reverse current, the second discharge driving circuit 1820 may enable the first control signal CTRL1, the first local bit line selection signal LYPB, the first local word line selection signal LXN, and the inverted first global word line selection signal GXNB.

Thus, the first local bit line switch P2 and the first discharge switch P3 may be turned-on to discharge the residual voltage of the bit line BL to the discharge terminal Vdis through the third discharge path D_c. Further, the first local word line switch N2 and the second discharge transistor N3 may be turned-on to discharge the residual voltage of the word line WL to the discharge terminal Vdis through the fourth discharge path D_d.

The first sub-decoder SB1 may generate the second local word line selection signal LXN of the first hierarchical bit line structure 130. That is, when the reverse enable signal ENR, the read/write enable signal RD/WT, the mat selection signal MAT_EN, and the cell selection signal Cell-Select are enabled and the discharge enable signal DIS_EN is disabled, that is, when applying the reverse current, the first sub-decoder SB1 may disable the second local word line selection signal LXB to a low level. In FIGS, the second local word line selection signal LXN that is disabled to a low level may be represented by "LXNB". Thus, the generation of the conductive path in the second hierarchical bit line structure 150 may be blocked. Therefore, the reverse current may be readily generated.

When the reverse enable signal ENR, the read/write enable signal RD/WT, the mat selection signal MAT_EN, and the discharge enable signal DI_EN are enabled and the cell selection signal Cell-Select is disabled, that is, when discharging after applying the reverse current, the first sub-decoder SB1 may enable the first local word line selection signal LXB to a high level. Thus, the fourth discharge path D_d may be formed in the second hierarchical bit line structure 150. That is, the first sub-decoder SB1 of example embodiments may individually control the first local word line selection signal LXN and the second global word line selection signal GXN.

In FIGS. 17 and 18, the second sub-decoder SB2 may be represented by an element that is separate from the first control signal generator 174 and the first sub-decoder SB1 may also be represented by an element that is separate from the second control signal generator 182. Alternatively, the first sub-decoder SB1 may be a part of the first discharge driving circuit 1730 or the reverse current applying circuit 1810 and the second sub-decoder SB2 may be a part of the second discharge driving circuit 1820 or the forward current applying circuit 1720.

Figure 19:
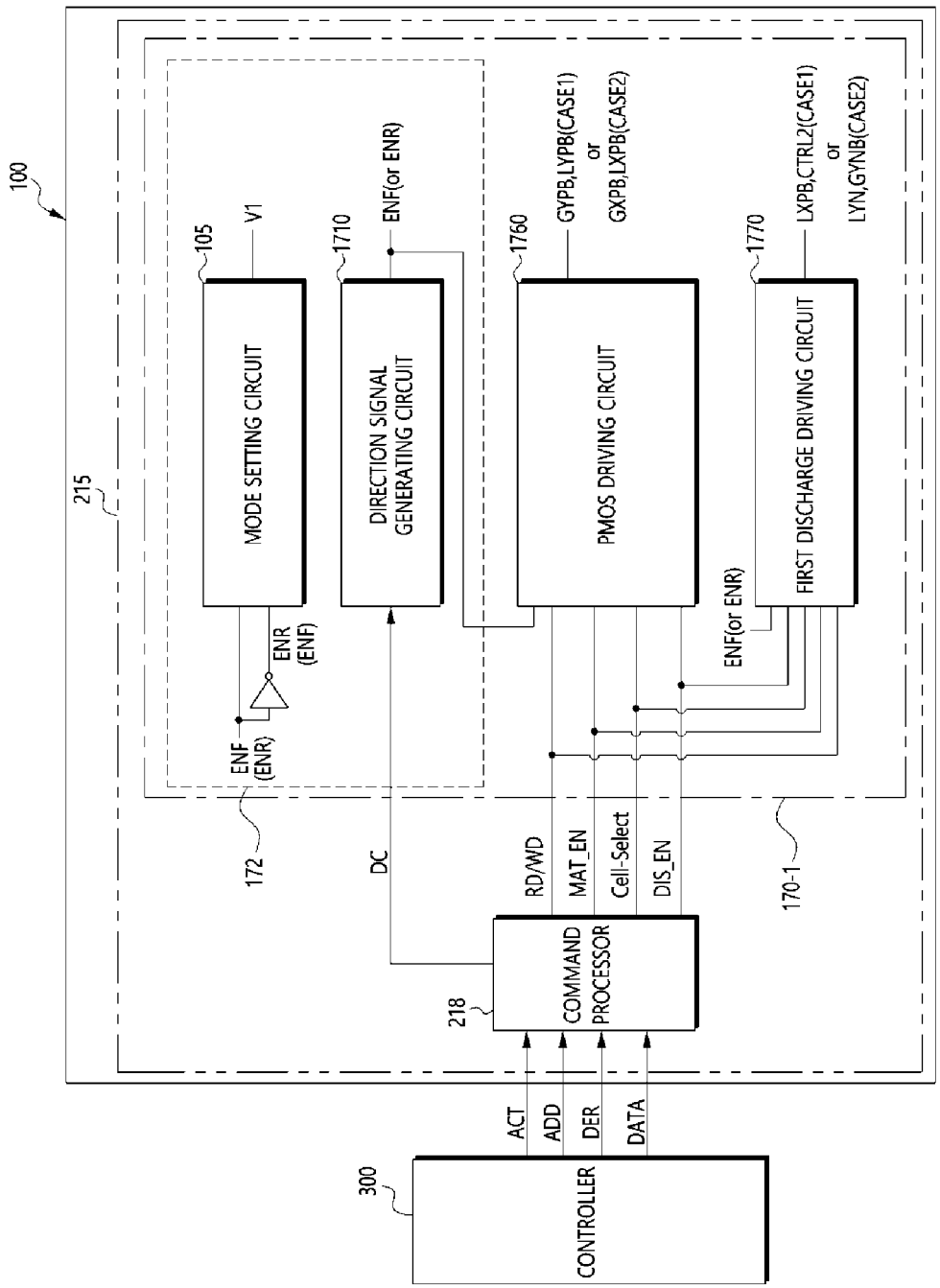
FIG. 19 is a block diagram illustrating a first direction-setting block in accordance with example embodiments.
Figure 20:
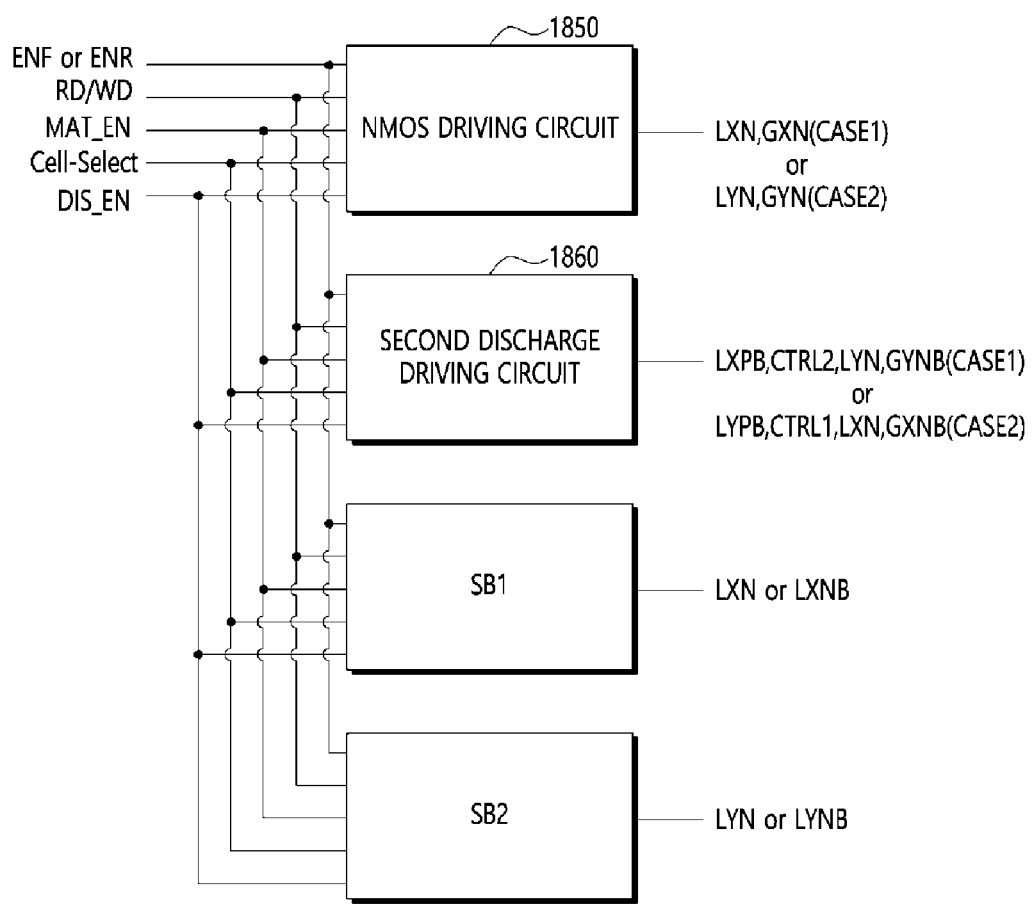
FIG. 20 is a block diagram illustrating a second direction-setting block in accordance with example embodiments.

FIG. 19 is a block diagram illustrating a first direction-setting block in accordance with example embodiments, and FIG. 20 is a block diagram illustrating a second direction-setting block in accordance with example embodiments.

Referring to FIG. 19, a first direction-setting block 170-1 may control operations of PMOS transistors P1~P6, which may control the memory cell MC, in response to a set direction.

The first direction-setting block 170-1 may be provided to each of the sub-control circuit regions 215a~215d. The first direction-setting block 170-1 may receive the basic control signals DC, RD/WT, MAT_EN, Cell-select, and DIS_EN that are generated from the command processor 218 by the commands ACT, ADD, DIR, and DATA that are provided from the controller 300.

The first direction-setting block 170-1 may include a direction controller 172, a PMOS driving circuit 1760, and a first discharge driving circuit 1770.

The direction controller 172 may include a mode setting circuit 105 and a direction signal generating circuit 1710. The direction controller 172 may have a configuration substantially the same as shown in FIG. 17. Thus, any further illustrations with respect to the direction controller 172 will be omitted herein for brevity.

The PMOS driving circuit 1760 may be a circuit for driving the PMOS transistors P1 to P6 of the variable resistive memory device 100. The PMOS driving circuit 1760 may output different control signal in Case 1 and Case 2 in accordance with the output signal ENF or ENR of the direction signal generating circuit 1710 (hereinafter referred to as a direction signal).

In Case 1, the direction signal generating circuit 1710 may output the forward enable signal ENF. In Case 2, the direction signal generating circuit 1710 may output the reverse enable signal ENR.

The PMOS driving circuit 1760 may receive the output signal ENR or ENR of the direction signal generating circuit 1710, i.e., the direction signal, the read/write enable signal RD/WT, the mat selection signal MAT_EN, the cell selection signal Cell-Select, and the discharge enable signal DIS_EN.

For example, when the read/write enable signal RD/WT, the mat selection signal MAT_EN, and the cell selection signal Cell_Select are enabled and the discharge enable signal DIS_EN is disabled, the PMOS driving circuit 1760 may receive the forward enable signal ENF. The PMOS driving circuit 1760 may enable the first global bit line selection signal GYPB and the first local bit line selection signal LYPB to generate the forward current FWD in Case 1. Thus, the first global bit line switch P1 and the first local bit line switch P2 may be turned-on to transmit the forward current FWD by the first voltage V1 to the bit line BL.

When the read/write enable signal RD/WT, the mat selection signal MAT_EN, and the cell selection signal Cell_Select are enabled and the discharge enable signal DIS_EN is disabled, the PMOS driving circuit 1760 may receive the reverse enable signal ENR. The PMOS driving circuit 1760 may enable the second global word line selection signal GXPB and the second local word line selection signal LXPB to generate the reverse current RVS in Case 2. Thus, the second global word line switch P4 and the second local word line switch P5 may be turned-on to transmit the reversed current RVS based on the first voltage V1 to the word line WL.

The PMOS driving circuit 1760 may include various logic circuits configured to selectively enable the first global bit line selection signal GYPB and the first local bit line selection signal LYPB or the second global word line selection signal GXPB and the second local word line selection signal LXPB based on combinations of the input control signals MAT_EN, the cell selection signal Cell-Select, discharge enable signal DIS_EN, and the direction signals ENF and ENR.

The first discharge driving circuit 1770 may drive any one of the PMOS transistors P1~P6 through which the current might not flow in a previous memory operation to discharge the residual voltage in the bit line BL or the word line WL. The first discharge driving circuit 1770 may receive the read/write enable signal RD/WT, the mat selection signal MAT_EN, the cell selection signal Cell-Select, and the discharge enable signal DIS_EN. The first discharge driving circuit 1770 may output a selection signal of the PMOS transistors to be turned-on in response to the direction signal ENF or ENR.

For example, after performing the memory operation by using the forward current FWD, the first discharge driving circuit 1770 may discharge the residual voltage of the selected word line WL by using the second local word line switch P5 through which the forward current FWD might not flow. That is, when the forward enable signal ENF, the read/write enable signal RD/WT, the mat selection signal MAT_EN, and the discharge enable signal DIS_EN are enabled and the cell selection signal Cell_Select is disabled, the first discharge driving circuit 1770 may enable the second local word line selection signal LXPB and the second control signal CTRL2 to a low level in Case 1. Thus, the second local word line switch P5 and the third discharge switch P6 may be turned-on to discharge the residual voltage of the selected word line WL that is connected to the second local word line switch P5 to the discharge terminal Vdis through the first discharge path D_a.

After performing the memory operation by using the reverse current RVS, the first discharge driving circuit 1770 may discharge the residual voltage of the selected bit line BL by using the first local bit line switch P2 through which the reverse current RVS might not flow. That is, when the reverse enable signal ENR, the read/write enable signal RD/WT, the mat selection signal MAT_EN, and the discharge enable signal DIS_EN are enabled and the cell selection signal Cell_Select is disabled, the first discharge driving circuit 1770 may enable the first local bit line selection signal LYPB and the first control signal CTRL1 to a low level in Case 1. Thus, the first local bit line switch P2 and the first discharge switch P3 may be turned-on to discharge the residual voltage of the selected bit line BL that is connected to the first local bit line switch P2 to the discharge terminal Vdis through the first discharge path D_a.

Referring to FIG. 20, a first direction-setting block 180-1 may control the operations of NMOS transistors N1~N6, which may control the memory cell MC, in response to the direction signals ENF and ENR that are generated from the first direction-setting block 170-1.

The second direction-setting block 180-1 may be provided to each of the sub-control circuit regions 215a~215d similarly to the second direction-setting block 180 in FIG. 18. As mentioned above, the forward enable signal ENF may be enabled in Case 1 and the reverse enable signal ENR may be enabled in Case 2.

The second direction-setting block 180-1 may include an NMOS driving circuit 1850, a second discharge driving circuit 1860, a first sub-decoder SB1, and a second sub-decoder SB2.

The NMOS driving circuit 1850 may be a circuit for driving the NMOS transistors N1 to N6 of the variable resistive memory device 100. The NMOS driving circuit 1850 may receive the direction signal ENF or ENR, the read/write enable signal RD/WT, the mat selection signal MAT_EN, the cell selection signal Cell-Select, and the discharge enable signal DIS_EN.

For example, when the read/write enable signal RD/WT, the mat selection signal MAT_EN, and the cell selection signal Cell_Select are enabled and the discharge enable signal DIS_EN is disabled, the NMOS driving circuit 1850 may receive the reverse enable signal ENR. The NMOS driving circuit 1850 may enable the first local word line selection signal LXN and the first global word line selection signal GXN to transmit the reverse current RVS in Case 1. Thus, the first local word line switch N2 and the first global word line switch N1 may be turned-on to form the conductive path from the first global word line GLW to which the second voltage V2 is applied to the selected word line WL.

Because a conductive path may also be formed between the first global bit line GBL1 and the selected bit line BL by the PMOS driving circuit 1760 of the first direction-setting block 170-1 in Case 1, the memory cell MC that is between the selected bit line BL and the selected word line WL may perform the memory operation by using the forward current FWD.

When the read/write enable signal RD/WT, the mat selection signal MAT_EN, and the cell selection signal Cell_Select are enabled and the discharge enable signal DIS_EN is disabled, the NMOS driving circuit 1850 may receive the reverse enable signal ENR. The NMOS driving circuit 1850 may enable the second local bit line selection signal LYN and the second global bit line selection signal GYN to transmit the reverse current RVS in Case 2. Thus, the second local bit line switch N5 and the second global bit line switch N4 may be turned-on to form the conductive path from the second global bit line GBL1 to the selected bit line BL.

Because a conductive path may also be formed between the second global bit line GBL2 and the selected word line WL by the PMOS driving circuit 1760 of the first direction-setting block 170-1 in Case 1, the memory cell MC that is between the selected bit line BL and the selected word line WL may perform the memory operation by using the reverse current RVS.

The second discharge driving circuit 1860 may selectively drive any one of the NMOS transistors N1~N6 through which the current might not flow in a previous memory operation to discharge the residual voltage in the bit line BL or the word line WL.

For example, after performing the memory operation by using the forward current FWD, when the forward enable signal ENF, the read/write enable signal RD/WT, the mat selection signal MAT_EN, and the discharge enable signal DIS_EN are enabled and the cell selection signal Cell_Select is disabled, the second discharge driving circuit 1860 may enable the second local bit line selection signal LYN and the inverted second global bit line selection signal GYNB to a high level in Case 2. Thus, the second local bit line switch N5 and the fourth discharge switch N6 may be turned-on to discharge the residual voltage of the selected bit line WL through the second discharge path D_b.

After performing the memory operation by using the reverse current RVS, when the reverse enable signal ENR, the read/write enable signal RD/WT, the mat selection signal MAT_EN, and the discharge enable signal DIS_EN are enabled and the cell selection signal Cell_Select is disabled, the second discharge driving circuit 1860 may enable the first local word line selection signal LXN and the inverted first global word line selection signal GXNB to a high level in Case 2. Thus, the first local word line switch N2 and the second discharge switch N3 may be turned-on to discharge the residual voltage of the selected word line WL through the fourth discharge path D_d.

The first sub-decoder SB1 may receive the direction signals ENF and ENR, the read/write enable signal RD/WT, the mat selection signal MAT_EN, the cell selection signal Cell_Select, and the discharge enable signal DIS_EN.

The first sub-decoder SB1 may be configured to control the first local word line selection signal LXN. When the discharge operation is performed by using the reverse current RVS after applying the forward current FWS in Case 1 and the reverse current RVS in Case 2, the first sub-decoder SB1 may enable the first local word line selection signal LXN to a high level. In contrast, when the discharge operation is performed by using the forward current FWD after applying the reverse current RVS in Case 2 and the forward current FWD in Case 1, the first sub-decoder SB1 may disable the first local word line selection signal LXN to a low level.

The second sub-decoder SB2 may be configured to control the second local bit line selection signal LYN. When the discharge operation is performed by using the forward current FWD after applying the reverse current RVS in Case 2 and the forward current FWD in Case 1, the second sub-decoder SB2 may enable the second local bit line selection signal LYN to a high level. In contrast, when the second discharge operation is performed after applying the forward current FWD in Case 1 and the reverse current RVS in Case 2, the second sub-decoder SB2 may disable the second local bit line selection signal LYN to a low level.

In FIG. 20, the first and second sub-decoders SB1 and SB2 may be separate from the second direction-setting block 180-1. Alternatively, the discharge transistors, connected parallel to the global bit line switch and the global word line switch in the NMOS driving circuit 1850 and the second discharge driving circuit 1860, may be removed. The discharge transistor of the bi-directional current-driven type memory device may be connected to only the local bit lines and only the local word lines. The first control signal CTRL1 as a gate signal of the bit line discharge transistor with the PMOS transistor and the second control signal CTRL2 as a gate signal of the word line discharge transistor with the NMOS transistor may be applied so that the direction of the discharge path may be controlled.

Further, the gates of the local bit line switch and the local word line switch with the NMOS transistor, among the local bit line switches and the local word line switches, may be connected to the first and second sub-decoders SB1 and SB2 to control the memory operation and the direction of the conductive path in the discharge operation.

Furthermore, the mode setting circuit 105 may selectively control the first voltage V1 that corresponds to a program voltage that is applied to the global bit line and the global word line.

Figure 21:
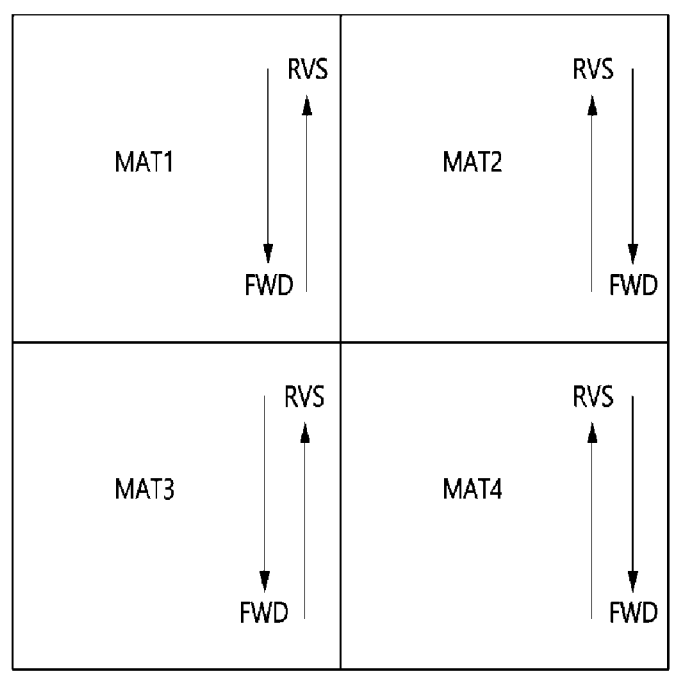
FIG. 21 is view illustrating operations for applying a current to a memory cell by a mat in accordance with example embodiments.

FIG. 21 is view illustrating operations for applying a current to a memory cell by a mat in accordance with example embodiments.

Referring to FIGS. 13 to 21, the bi-direction current-driven type memory device of example embodiments may control the current that is applied to the memory cell MC by the mats MAT1~MAT4, the current having different directions.

For example, the memory cell MC in the odd mats MAT1 and MAT3 may perform the memory operation by using the forward current FWD for a predetermined time period. After the predetermined time period, the memory cell MC in the odd mats MAT1 and MAT3 may then perform the memory operation by using the reverse current RVS.

The memory cell MC in the even mats MAT2 and MAT4 may perform the memory operation by using the reverse current RVS for a predetermined time period. After the predetermined time period, the memory cell MC in the odd mats MAT2 and MAT4 may then perform the memory operation by using the forward current FWD.

In example embodiments, the mats may be classified into the odd mats and the even mats. Alternatively, the current-applying ways of the memory cells in the adjacent mats may be substantially the same or different from each other.

The currents with different directions may also be applied to the memory cell in the same mat. For example, when the forward current FWD is applied to the memory cell in the first mat MAT1 before the critical number, an xth memory cell in the first mat MAT1 may reach the critical number by a frequent selection that is different from other memory cells so that the xth memory cell may perform the memory operation by using the reverse current RVS after the critical number.

Figure 22:
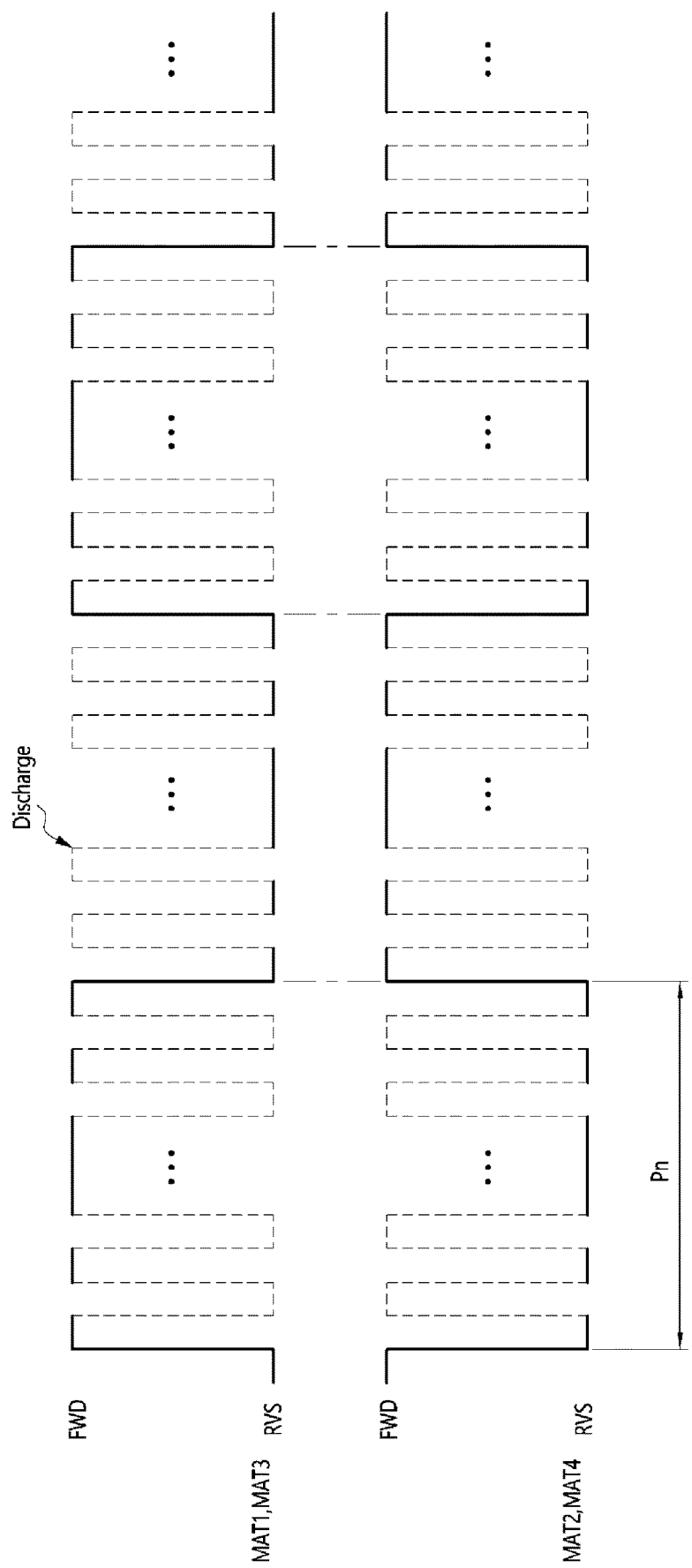
FIG. 22 is a timing chart illustrating operations for applying a current to a memory cell by a mat in accordance with example embodiments.

FIG. 22 is a timing chart illustrating operations for applying a current to a memory cell by a mat in accordance with example embodiments.

Referring to FIG. 22, for example, a specific memory cell MC in the first and third mats MAT1 and MAT3 may perform a memory operation by using the forward current FWD until the specific memory cell reaches the critical number.

When the specific memory cell MC is greater than the critical number, the direction of the current in performing the memory operation may be converted to the reverse direction.

Similarly, a specific memory cell MC in the second and fourth mats MAT2 and MAT may perform a memory operation by using the reverse current RVS until the specific memory cell reaches the critical number.

A reference numeral Pn in FIG. 22 may indicate a critical number section of the memory cell. A dotted line may indicate a section of the discharge operation. As mentioned above, the discharge operation may be performed after applying the current for the memory operation. The discharge operation may be performed with a current that flows in the opposite direction compared to the direction of the current for the memory operation.

According to example embodiments, the current directions of the memory cell MC may be alternately changed after each period Pn, which is constant. The discharge operation may be performed in the opposite direction compared to the direction of the current for the memory operation. Thus, a drift that causes the deformation of operational characteristics in the memory cell MC may be prevented. Further, the transistors for driving the memory cell may also be alternately operated to prevent the transistors from deteriorating.

Figure 23:
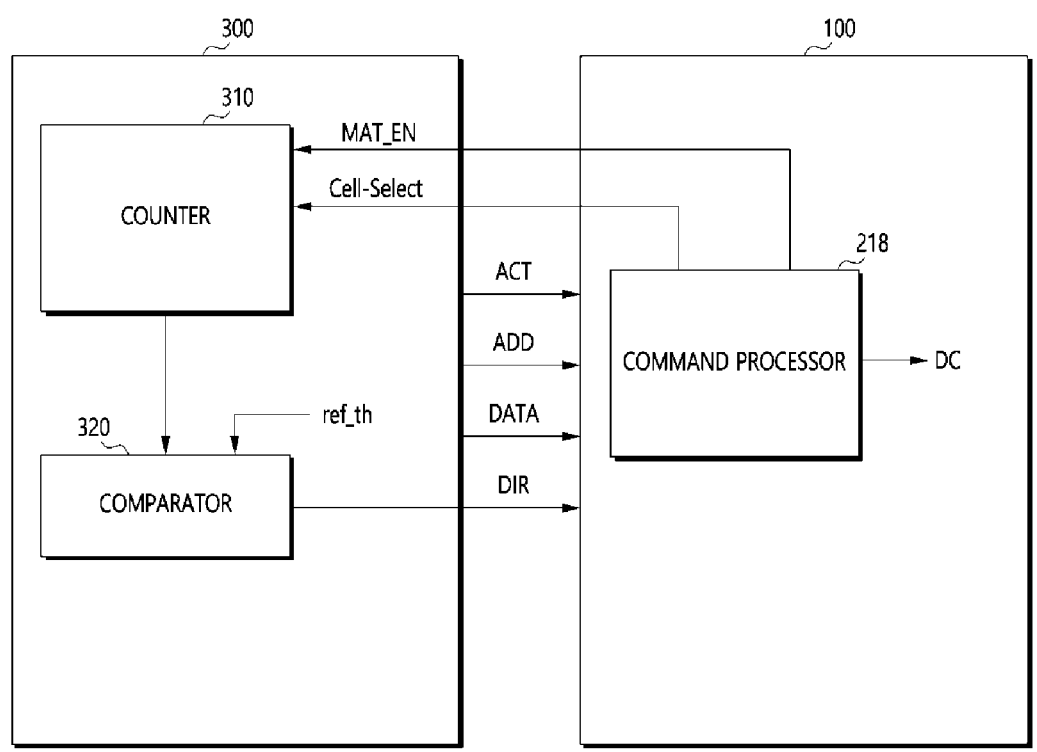
FIG. 23 is a block diagram illustrating a controller in accordance with example embodiments.

FIG. 23 is a block diagram illustrating a controller in accordance with example embodiments.

Referring to FIG. 23, the controller 300 may include a counter 310 and a comparator 320.

The counter 310 may receive the mat selection signal MAT_EN and the cell selection signal Cell-select from the command processor 218. The counter 310 may count the accumulated selection number of the memory cell MC in the selected mat MAT. The counter 310 may include any one of the general counter circuits with an accumulation function.

The counter 310 may further include a memory cell information table with a storage function. When the memory cell in a specific position is selected, the memory cell information table may accumulate and store the selected numbers.

The comparator 320 may compare the accumulated counting numbers that are output from the counter 310 with a critical number ref-th. When the accumulated counting number is substantially the same as the critical number ref-th, the comparator 320 may output the direction command DIR as a comparison result. For example, the critical number ref-th may be set as a value before the selected memory cell is determined to be a weak cell or a failed cell, considered based on a point at which a specific amount of deterioration occurs, such as a drift that occurs by continuously applying the current with the same direction to the memory cell MC, or another specific determination criteria of a weak cell.

The critical number ref-th may be stored in a temporary storage of the controller 300. The critical number ref-th may be provided in the comparison operation of the comparator 320 as the input signal. The comparator 320 may include a general comparison circuit.

The command processor 218 may generate the direction control signal DC in accordance with the changes of the direction command DIR.

In example embodiments, the counter 310 and the comparator 320 may be arranged in the controller 300. Alternatively, the counter 310 and the comparator 320 may be arranged in the control circuit 215.

Figure 24:
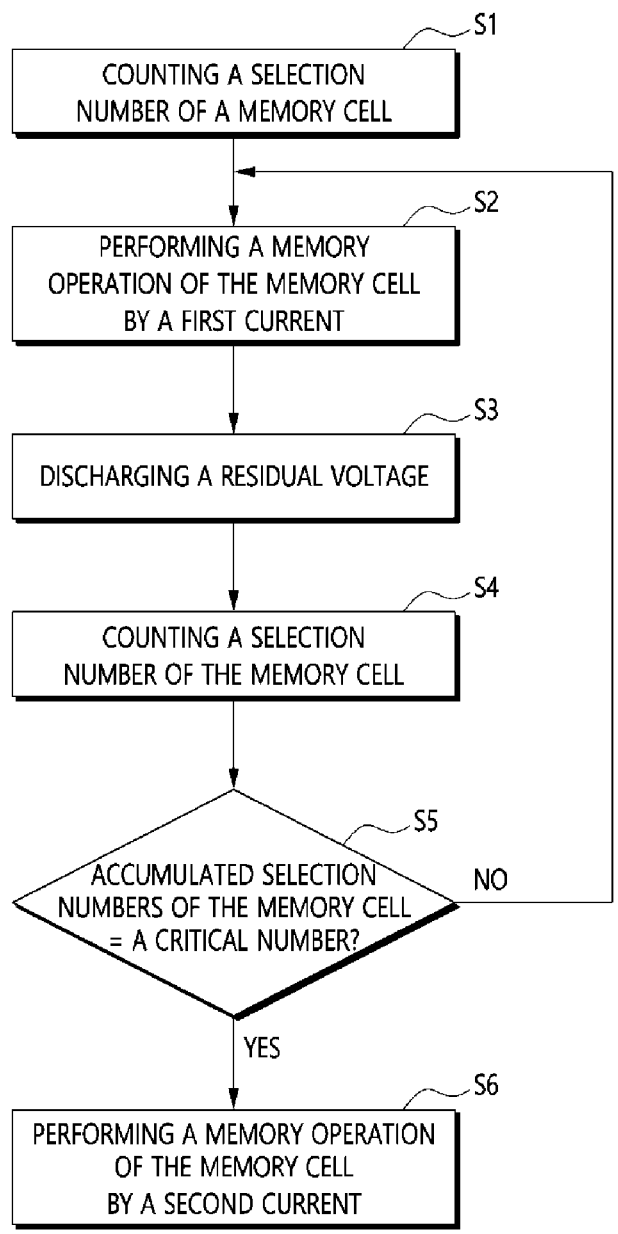
FIG. 24 is a flow chart illustrating operations of a bi-directional current-driven type memory device in accordance with example embodiments.

FIG. 24 is a flow chart illustrating operations of a bi-directional current-driven type memory device in accordance with example embodiments.

Referring to FIG. 24, in step S1, the selected numbers of the memory cell MC in a specific address may be counted. For example, the counter 310 may count the selected numbers of the memory cell MC in a specific position by the mat. The counter 310 may accumulate the selected numbers.

In step S2, the selected memory cell MC may perform the memory operation by using a first current. The first current may include the forward current FWD or the reverse current RVS.

In step S3, in order to perform the next memory operation of the selected memory cell MC, the residual voltages in the bit line BL and the word line WL that are connected to the selected memory cell MC may be discharged. The discharge operation may be performed by using a second current with the opposite direction compared to the direction of the first current. The memory operation and the discharge operation with the first current (forward current) and the second current (reverse current) may be illustrated in detail with reference to FIGS. 4A to 12. Thus, any further illustrations with respect to the memory operation and the discharge operation will be omitted herein for brevity.

In step S4, the accumulated selection number of the memory cell MC may be compared with the critical number ref-th. The comparator 320 may perform the comparison operation.

When the accumulated selection number of the selected memory cell MC reaches the critical number ref-th, the comparator 320 may change and output the direction command DIR. Thus, when the memory cell MC is selected next, in step S5, the memory cell MC may perform the memory operation by using the second current that flows in the opposite direction compared to the direction of the first current.

For example, when the previous memory operation is performed by using the forward current FWD, the currently selected memory cell MC may perform the memory operation by using the reverse current RVS. In contrast, when the previous memory operation is performed by using the reverse current RVS, the currently selected memory cell MC may perform the memory operation by using the forward current FWD.

When the accumulated selection number of the selected memory cell MC does not reach to the critical number ref-th, in step S2, the currently selected memory cell MC may perform the memory operation by using the first current.

According to example embodiments, the bi-directional currents may be applied to the memory cell to perform the memory operation, thereby reducing the deterioration of the resistive layer. Further, the number of discharge switches and sub-decoders that operate one memory cell may be decreased to reduce the area of the mat.

The above described embodiments of the present invention are intended to illustrate and not to limit the present invention. Various alternatives and equivalents are possible. The invention is not limited by the embodiments described herein. Nor is the invention limited to any specific type of semiconductor device. Another additions, subtractions, or modifications are obvious in view of the present disclosure and are intended to fall within the scope of the appended claims.

What is claimed is:

1. A variable resistive memory device comprising:
   a memory cell including a first electrode, a second electrode and a memory layer, the memory layer interposed between the first electrode and the second electrode;
   a first current-applying block configured to apply a first current to the first electrode that flows from the first electrode to the second electrode;
   a second current-applying block configured to apply a second current to the second electrode that flows from the second electrode to the first electrode; and
   a mode setting circuit configured to selectively provide any one of the first electrode of the first current-applying block and the second electrode of the second current-applying block with a first voltage,
   wherein, when the memory cell is selected, the selected current-applying block, among the first current-applying block and the second current-applying block, is driven,
   wherein a second voltage is applied to the second electrode when the first current-applying block is selected, and the second voltage is applied to the first electrode when the second current-applying block is selected, and
   wherein the first voltage is higher than the second voltage by a threshold voltage.

2. The variable resistive memory device of claim 1, wherein the memory cell further comprises a resistive layer, and
wherein a conductive path is formed in the resistive layer when a voltage difference between the first electrode and the second electrode is greater than the threshold voltage.

3. The variable resistive memory device of claim 1, wherein the first electrode comprises a bit line and the second electrode comprises a word line,
wherein the first current-applying block comprises:
a first hierarchical bit line structure connected between the mode setting circuit and the bit line; and
a first hierarchical word line structure connected between the word line and a voltage terminal, the first hierarchical word line structure configured to receive the second voltage.

4. The variable resistive memory device of claim 3, wherein the first hierarchical bit line structure comprises:
a first local bit line selectively connected to the bit line by a first local bit line switch;
a first global bit line selectively connected to the first local bit line by a first global bit line switch, the first global bit line configured to receive the first voltage; and
a first discharge switch connected between the first local bit line and a discharge terminal to form a discharge path in the first hierarchical bit line structure in response to a first control signal.

5. The variable resistive memory device of claim 4, wherein the first control signal is set to be enabled after performing a memory operation of the memory cell by using the second current, and
wherein the first discharge switch is turned-on by the enabled first control signal.

6. The variable resistive memory device of claim 4, wherein the first global bit line switch, the first local bit line switch, and the first discharge switch comprise PMOS transistors.

7. The variable resistive memory device of claim 3, wherein the first hierarchical word line structure comprises:
a first local word line selectively connected to the word line by a first local word line switch;
a first global word line selectively connected to the first local word line by a first global word line switch, the first global word line configured to receive the second voltage; and
a second discharge switch connected between the first local word line and a discharge terminal,
wherein the second discharge switch is turned-on when the first global word line switch is turned-off to selectively form a discharge path formed in the first hierarchical word line structure.

8. The variable resistive memory device of claim 7, wherein the first global word line switch, the first local word line switch, and the second discharge switch comprise NMOS transistors.

9. The variable resistive memory device of claim 7, wherein the first hierarchical word line structure further comprises a first sub-decoder configured to control the first local word line selection signal that is input to a gate of the first local word line switch,
wherein the first sub-decoder enables the first local word line selection signal when a memory operation is performed by using the first current and when a discharge operation is performed after completing a memory operation by using the second current, and
wherein the first-sub decoder disables the first local word line selection signal when the memory operation is performed by using the second current and when a discharge operation is performed after completing the memory operation by using the first current.

10. The variable resistive memory device of claim 1, wherein the first electrode comprises a bit line and the second electrode comprises a word line,
wherein the second current-applying block comprises:
a second hierarchical word line structure connected between the mode setting circuit and the word line; and
a second hierarchical bit line structure connected between the bit line and a voltage terminal, the second hierarchical bit line structure configured to receive the second voltage.

11. The variable resistive memory device of claim 10, wherein the second hierarchical word line structure comprises:
a second local word line selectively connected to the word line by a second local word line switch;
a second global word line selectively connected to the second local word line by a second global word line switch, the second global word line configured to receive the first voltage from the mode setting circuit; and
a third discharge switch connected between the second local word line and a discharge terminal to form a discharge path in the second hierarchical word line structure in response to a second control signal.

12. The variable resistive memory device of claim 11, wherein the second control signal is set to be enabled after performing a memory operation of the memory cell by using the first current, and
wherein the third discharge switch is turned-on by the enabled second control signal.

13. The variable resistive memory device of claim 11, wherein the second global word line switch, the second local word line switch, and the third discharge switch comprise PMOS transistors.

14. The variable resistive memory device of claim 10, wherein the second hierarchical bit line structure comprises:
a second local bit line selectively connected to the bit line by a second local bit line switch;
a second global bit line selectively connected to the second local bit line by a second global bit line switch, the second global bit line configured to receive the second voltage; and
a fourth discharge switch connected between the second local bit line and a discharge terminal,
wherein the fourth discharge switch is turned-on when the second global bit line switch is turned-off to selectively form a discharge path that is formed in the second hierarchical bit line structure.

15. The variable resistive memory device of claim 11, wherein the second global word line switch, the second local word line switch, and the third discharge switch comprise NMOS transistors.

16. The variable resistive memory device of claim 14, wherein the second hierarchical bit line structure further comprises a second sub-decoder configured to control the second local bit line selection signal input to a gate of the second local bit line switch,
wherein the second sub-decoder enables the second local bit line selection signal when a memory operation is performed by using the second current and when a discharge operation is performed after completing a memory operation by using the first current, and wherein the second-sub decoder disables the second local bit line selection signal when the memory operation is performed by using the first current and when a discharge operation is performed after completing the memory operation by using the second current.

17. The variable resistive memory device of claim 1, wherein the mode setting circuit comprises:
- a forward determining unit configured to apply the first voltage to the first current-applying block in response to a forward enable signal; and
- a reverse determining unit configured to apply the first voltage to the second current-applying block in response to a reverse enable signal with a level that is opposite to the forward enable signal.

18. A memory system comprising:
- a controller configured to output a control command; and
- a variable resistive memory device including a control circuit and a plurality of mats, the control circuit configured to receive the control command from the controller to generate control signals, each of the mats including a plurality of memory cells configured to perform a memory operation and a discharge operation by using a forward current or a reverse current in response to the control signals,
- wherein the memory cells are positioned at intersection points of a plurality of bit lines and a plurality of word lines,
- wherein each of the plurality of bit lines is selectively connected to a first hierarchical bit line structure configured to receive a first voltage and a second hierarchical bit line structure configured to receive a second voltage that is lower than the first voltage,
- wherein each of the plurality of word lines is selectively connected to a first hierarchical word line structure configured to receive the second voltage and a second hierarchical word line structure configured to receive the first voltage, and
- wherein the control circuit is configured to generate control signals for selecting the mat and the memory cell in the selected mat, control signals for transmitting the forward current, control signals for transmitting the reverse current, and a discharge control signal for discharging a selected bit line and a selected word line during the discharge operation, and
- wherein a current for the discharge operation flows in an opposite direction compared to a current direction for the memory operation.

19. The memory system of claim 18, wherein the control command of the controller comprises a direction command for changing a direction of a current that flows through the memory cell based on a selected number of the memory cell.

20. The memory system of claim 18, wherein the controller comprises:
- a counter configured to receive the control signals for selecting the mat and the memory cell and to accumulate a selection number of the memory cell; and
- a comparator configured to compare the accumulated selection number of the memory cell that is provided from the counter with a critical number, the comparator configured to output a direction command for changing a direction of a current that flows through the memory cell when the accumulated selection number is substantially the same as the critical number.

21. The memory system of claim 19, wherein the control circuit comprises a command process configured to generate the control signals for selecting the mat and the memory cell, the control signals for transmitting the forward current, and the control signals for transmitting the reverse current.

22. The memory system of claim 21, wherein the command processor is configured to generate a direction control signal for selecting any one of the control signals for transmitting the forward current and the control signals for transmitting the reverse current in response to the direction command that is provided from the controller.

23. The memory system of claim 18, wherein the first hierarchical bit line structure comprises a first local bit line that is selectively connected to the bit line by a first local bit line switch, and a first global bit line that is selectively connected to the first local bit line by a first global bit line switch, the first global bit line configured to selectively receive the first voltage,
- wherein the first hierarchical word line structure comprises a first local word line that is selectively connected to the word line by a first local word line switch, and a first global word line that is selectively connected to the first local word line by a first global word line switch, the first global word line configured to selectively receive the second voltage,
- wherein the second hierarchical word line structure comprises a second local word line that is selectively connected to the word line by a second local word line switch, and a second global word line that is selectively connected to the second local word line by a second global word line switch, the second global word line configured to selectively receive the first voltage, and
- wherein the second hierarchical bit line structure comprises a second local bit line that is selectively connected to the bit line by a second local bit line switch, and a second global bit line that is selectively connected to the second local bit line by a second global bit line switch, the second global bit line configured to selectively receive the second voltage.

24. The memory system of claim 23, wherein the first hierarchical bit line structure further comprises a first discharge switch that is connected between the first local bit line and a discharge terminal to be driven in response to a first control signal that corresponds to the discharge control signal,
- wherein the first hierarchical word line structure further comprises a second discharge switch that is connected between the first local word line and the discharge terminal to be driven along a direction opposite to the first global word line switch,
- wherein the second hierarchical word line structure further comprises a third discharge switch that is connected between the second local word line and the discharge terminal to be driven in response to a second control signal, which has a level opposite to a level of the first control signal, corresponding to the discharge control signal, and
- wherein the second hierarchical bit line structure further comprises a fourth discharge switch that is connected between the second local bit line and the discharge terminal to be driven along a direction opposite to the second global bit line switch.

25. The memory system of claim 24, wherein the control signals for controlling the forward current comprise a forward enable signal for selectively transmitting the first voltage to the first global bit line, a first global bit line selection signal for controlling the first global bit line switch, a first local bit line selection signal for controlling the first local bit line switch, a first local word line selection signal for controlling the first local word line switch and a first global word line selection signal for controlling the first global word line switch, and wherein all the control signals for controlling the forward current are enabled when the forward current is applied to the selected memory cell.

26. The memory system of claim 24, wherein the control signals for controlling the reverse current comprise a reverse enable signal for selectively transmitting the first voltage to the second global word line, a second global word line selection signal for controlling the second global word line switch, a second local word line selection signal for controlling the second local word line switch, a second local bit line selection signal for controlling the second local bit line switch and a second global bit selection signal for controlling the second global bit line switch, and wherein all the control signals for controlling the reverse current are enabled when the reverse current is applied to the selected memory cell.

27. The memory system of claim 24, wherein the control circuit is configured to generate a discharge enable signal after completing a memory operation of the selected memory cell with the forward current and a memory operation of the selected memory cell with the reverse current.

28. The memory system of claim 27, wherein the second control signal, the second local word line selection signal, the second local bit line selection signal, and an inverted second global bit line selection signal are enabled as the discharge control signal when the discharge enable signal is enabled after completing the memory operation of the selected memory cell with the forward current.

29. The memory system of claim 28, wherein the first control signal, the first local bit line selection signal, the first local word line selection signal and an inverted first global bit line selection signal are enabled as the discharge control signal when the discharge enable signal is enabled after completing the memory operation of the selected memory cell with the reverse current.

30. The memory system of claim 29, further comprising a first sub-decoder configured to generate and control the first local word line selection signal, and a second sub-decoder configured to generate and control the second local bit line selection signal, wherein the first sub-decoder enables the first local word line selection signal when the forward current is applied and when the discharge operation is performed after applying the reverse current, and wherein the second sub-decoder enables the second local bit line selection signal when the reverse current is applied and when the discharge operation is performed after applying the forward current.

31. The memory system of claim 23, wherein the first global bit line switch, the first local bit line switch, and the first discharge switch in the first hierarchical bit line structure, and the second global word line switch, the second local word line switch, and the third discharge switch in the second hierarchical word line structure comprise pull-up elements, and wherein the first global word line switch, the first local word line switch, and the second discharge switch in the first hierarchical word line structure, and the second global bit line switch, the second local bit line switch, and the fourth discharge switch in the second hierarchical bit line structure comprise pull-down elements.

32. The memory system of claim 22, further comprising a mode setting circuit configured to apply a first voltage to any one that is selected from the first global bit line and the second global word line in response to the direction control signal.

33. The memory system of claim 20, wherein the critical number is set as a value before the selected memory cell is determined to be a weak cell based on the selection number of the memory cell.

34. A method of driving a variable resistive memory device, the variable resistive memory device including a memory cell including a bit line, a resistive layer and a word line, a first hierarchical bit line structure selectively connected between the bit line and a first voltage terminal configured to provide a first voltage, a second hierarchical bit line structure connected between a second voltage terminal configured to provide a second voltage lower than the first voltage and the bit line, a first hierarchical word line structure connected between the word line and the second voltage terminal, and a second hierarchical word line structure connected between the word line and the first voltage terminal, the method comprising:

performing a memory operation of the memory cell by using a forward current that flows from the first hierarchical bit line structure to the first hierarchical word line structure through the memory cell;

forming discharge paths in the second hierarchical word line structure and the second hierarchical bit line structure after completing the memory operation of the memory cell with the forward current to discharge residual voltages in the bit line and the word line;

performing a memory operation of the memory cell by using a reverse current that flows from the second hierarchical word line structure to the second hierarchical bit line structure through the memory cell; and forming discharge paths in the first hierarchical bit line structure and the first hierarchical word line structure after completing the memory operation of the memory cell with the reverse current to discharge residual voltages in the bit line and the word line.

35. The method of claim 34, wherein the first hierarchical bit line structure and the second hierarchical word line structure comprise discharge switches, and the discharge switches in the first hierarchical bit line structure and the second hierarchical word line structure comprise transistors with a type that is substantially the same as that of switches in the first hierarchical bit line structure and the second hierarchical word line structure, and wherein the first hierarchical word line structure and the second hierarchical bit line structure comprise discharge switches, and the discharge switches in the first hierarchical word line structure and the second hierarchical bit line structure comprise transistors with a type that is substantially the same as that of switches in the first hierarchical word line structure and the second hierarchical bit line structure.

36. The method of claim 34, wherein performing the memory operation by using the forward current and forming the discharge paths in the second hierarchical word line structure and the second hierarchical bit line structure to discharge the residual voltage in the bit line and the word line are repeatedly performed a critical number of times.

37. The method of claim 35, wherein performing the memory operation by using the reverse current and forming the discharge paths in the first hierarchical bit line structure and the first hierarchical word line structure to discharge the residual voltage in the bit line and the word line are repeatedly performed a critical number of times.

38. The method of claim 37, wherein the critical number is set as a value before the selected memory cell is determined to be a weak cell based on the selection number of the memory cell.

39. A variable resistive memory device comprising:
- a memory cell including a bit line, a resistive layer, and a word line;
- a first hierarchical bit line structure including a plurality of first conductive lines that are selectively connected between the bit line and a first voltage terminal, a plurality of first switches that are connected between the first conductive lines, and a first discharge switch that is connected between any one of the first conductive lines and a discharge terminal;
- a first hierarchical word line structure including a plurality of second conductive lines that are selectively connected between the word line and a second voltage terminal, a plurality of second switches that are connected between the second conductive lines, and a second discharge switch that is connected between any one of the second conductive lines and the discharge terminal;
- a second hierarchical word line structure including a plurality of third hierarchical conductive lines that are selectively connected between the word line and the first voltage terminal, a plurality of third switches that are connected between the third hierarchical conductive lines, and a third discharge switch that is connected between any one of the third hierarchical conductive lines and the discharge terminal; and
- a second hierarchical bit line structure including a plurality of fourth hierarchical conductive lines that are selectively connected between the bit line and the second voltage terminal, a plurality of fourth switches that are connected between the fourth hierarchical conductive lines, and a fourth discharge switch that is connected between any one of the fourth hierarchical conductive lines and the discharge terminal,
- wherein a voltage difference for forming a conductive path in the resistive layer is formed between a first voltage that is provided from the first voltage terminal and a second voltage that is provided from the second voltage terminal,
- wherein the first switches and the first discharge switch in the first hierarchical bit line structure and the third switches and the third discharge switch in the second hierarchical word line structure comprise first conductive type transistors, and
- wherein the second switches and the second discharge switch in the first hierarchical word line structure and the fourth switches and the fourth discharge switch in the second hierarchical bit line structure comprise second conductive type transistors that are opposite to the first conductive type transistors.

40. The variable resistive memory device of claim 39, wherein the first voltage is higher than the second voltage by greater than a threshold voltage for turning-on the resistive layer,
- wherein the first conductive type transistors comprise PMOS transistors, and
- wherein the second conductive type transistors comprise NMOS transistors.

* * * * *